(12) United States Patent
Jun et al.

(10) Patent No.: US 11,917,759 B2
(45) Date of Patent: Feb. 27, 2024

(54) ELECTRONIC DEVICE INCLUDING FLEXIBLE SUBSTRATE

(71) Applicant: SAMSUNG ELECTRONICS CO., LTD., Suwon-si (KR)

(72) Inventors: Sungsoo Jun, Suwon-si (KR); Changho Park, Suwon-si (KR); Jinman Kim, Suwon-si (KR); Munjin Jeong, Suwon-si (KR); Wooyoung Jeong, Suwon-si (KR); Namjun Kim, Suwon-si (KR); Yonghwa Kim, Suwon-si (KR); Dongmyeong Park, Suwon-si (KR); Youngmoon Park, Suwon-si (KR); Youngkyu Kim, Suwon-si (KR); Minwoo Yoo, Suwon-si (KR); Hyunsuk Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 212 days.

(21) Appl. No.: 17/433,832

(22) PCT Filed: Aug. 4, 2021

(86) PCT No.: PCT/KR2021/010210
§ 371 (c)(1),
(2) Date: Aug. 25, 2021

(87) PCT Pub. No.: WO2022/030988
PCT Pub. Date: Feb. 10, 2022

(65) Prior Publication Data
US 2022/0346232 A1    Oct. 27, 2022

(30) Foreign Application Priority Data

Aug. 4, 2020   (KR) .................. 10-2020-0097668

(51) Int. Cl.
*H05K 1/14* (2006.01)
*H04M 1/02* (2006.01)
(Continued)

(52) U.S. Cl.
CPC ............ *H05K 1/14* (2013.01); *H04M 1/0249* (2013.01); *H05K 1/0277* (2013.01); *H05K 5/0086* (2013.01); *H05K 7/1427* (2013.01)

(58) Field of Classification Search
CPC ..... H05K 1/14; H05K 5/0086; H05K 57/1427
(Continued)

(56) References Cited

U.S. PATENT DOCUMENTS 8,879,273 B2 * 11/2014 Fujimori .................. H01Q 1/52
361/679.01
2014/0135071 A1    5/2014 Lee et al.
(Continued)

FOREIGN PATENT DOCUMENTS

CN      207910843      9/2018
CN      209233874      8/2019
(Continued)

OTHER PUBLICATIONS

International Search Report and Written Opinion dated Nov. 30, 2021 in corresponding International Application No. PCT/KR2021/010210.
(Continued)

*Primary Examiner* — Binh B Tran
(74) *Attorney, Agent, or Firm* — Nixon & Vanderhye P.C.

(57) ABSTRACT

An electronic device includes: a housing including a plate and a back plate facing a second surface of the plate and including a planar area facing a first direction, a display module including a display disposed on a first surface of the plate, a battery and a circuit board disposed on the second surface of the plate, a first flexible substrate extending from
(Continued)

the display module, and a second flexible substrate extending from the circuit board to the first flexible substrate across the battery. The first flexible substrate includes a first connector, and the second flexible substrate includes a second connector. The first flexible substrate and the second flexible substrate are configured such that the first connector and the second connector are coupled in a second direction different from the first direction.

15 Claims, 24 Drawing Sheets

(51) Int. Cl.
*H05K 1/02* (2006.01)
*H05K 5/00* (2006.01)
*H05K 7/14* (2006.01)

(58) Field of Classification Search
USPC ..................................................... 361/749
See application file for complete search history.

(56) References Cited

U.S. PATENT DOCUMENTS

| | | |
|---|---|---|
| 2014/0140018 A1 | 5/2014 | Malek et al. |
| 2018/0046305 A1 | 2/2018 | Kang et al. |
| 2019/0204651 A1 | 7/2019 | Bai et al. |
| 2020/0136243 A1* | 4/2020 | Shin .......................... H01Q 1/38 |
| 2020/0142238 A1 | 5/2020 | Schindler et al. |

FOREIGN PATENT DOCUMENTS

| | | |
|---|---|---|
| JP | 10-190803 | 7/1998 |
| JP | 2018-170296 | 11/2018 |
| KR | 1996-0006425 | 2/1996 |
| KR | 10-1976179 | 4/2019 |
| WO | WO 2019/080210 A1 | 5/2019 |
| WO | WO 2019/127705 A1 | 7/2019 |

OTHER PUBLICATIONS

Extended European Search Report dated Oct. 31, 2023 for EP Application No. 21853235.6.

* cited by examiner

100

ELECTRONIC DEVICE INCLUDING FLEXIBLE SUBSTRATE

TECHNICAL FIELD

This application is the U.S. national phase of International Application No. PCT/KR2021/010210 filed 4 Aug. 2021, which designated the U.S. and claims priority to KR Patent Application No. 10-2020-0097668 filed 4 Aug. 2020, the entire contents of each of which are hereby incorporated by reference.

The disclosure relates to an electronic device including a flexible substrate.

BACKGROUND ART

An electronic device may include a flexible substrate for electrically connecting two or more physically separated parts. At least part of the flexible substrate may be formed to be flexible, and thus a limited inner space of the electronic device may be efficiently used. The flexible substrate may be electrically connected with another flexible substrate.

The above information is presented as background information only to assist with an understanding of the disclosure. No determination has been made, and no assertion is made, as to whether any of the above might be applicable as prior art with regard to the disclosure.

DISCLOSURE

Technical Problem

The flexible substrate may extend from a circuit board, a battery, or a display module located on an X-Y plane. The flexible substrate and the other flexible substrate may be disposed on the X-Y plane, and connectors thereof may be aligned and coupled with each other in the Z-axis direction. In this case, tension may act on the flexible substrates in a direction substantially perpendicular to the direction in which the connectors are coupled. The connectors may be damaged by the tension. Furthermore, in the electronic device having the relatively limited inner space, there may be a limitation depending on the X-Y sizes of the connectors. In addition, the flexible substrates or the connectors may be damaged when the flexible substrates are bent with large curvatures in the limited inner space.

Embodiments of the disclosure address at least the above-mentioned problems and/or disadvantages and to provide at least the advantages described below. Accordingly, embodiments of the disclosure provide an electronic device including a flexible substrate coupling structure for efficiently using a limited inner space.

Embodiments of the disclosure provide an electronic device including a flexible substrate coupling structure for providing a sufficient space in which a flexible substrate is able to be bent.

Embodiments of the disclosure provide an electronic device including a bracket structure for mechanically constraining a flexible substrate.

Technical Solution

In accordance with an example embodiment of the disclosure, an electronic device includes: a housing including a plate, a frame surrounding the plate, and a back plate facing a second surface of the plate and coupled to the frame, the back plate including a planar area facing a first direction, a display module including a display disposed on a first surface of the plate structure, a battery and a circuit board disposed on the second surface of the plate, a first flexible substrate extending from the display module to the second surface of the plate structure through an opening area of the plate, and a second flexible substrate extending from the circuit board to the first flexible substrate across the battery. The first flexible substrate includes a first area, at least part of which is disposed in the opening area, a second area extending from the first area toward the back plate, and a first connector disposed on the second area. The second flexible substrate includes a third area, at least part of which is disposed between the battery and the back plate, a fourth area extending from the third area toward the second surface of the plate structure, and a second connector disposed on the fourth area. The first flexible substrate and the second flexible substrate are configured such that the first connector and the second connector are coupled in a second direction different from the first direction.

In accordance with an example embodiment of the disclosure, an electronic device includes: a plate including a first surface, a second surface facing a direction opposite a direction of the first surface, and an opening area formed through the first surface and the second surface, a display module including a display disposed on the first surface and including a planar area facing a first direction, a circuit board disposed on the second surface, a first flexible substrate extending from the display module to the second surface through the opening area and including a first connector, and a second flexible substrate extending from the circuit board and including a second connector, wherein the first connector and the second connector are coupled in a direction substantially perpendicular to the first direction.

Other aspects, advantages, and salient features of the disclosure will become apparent to those skilled in the art from the following detailed description, which, taken in conjunction with the annexed drawings, discloses various embodiments of the disclosure.

Advantageous Effects

According to various embodiments of the disclosure, the electronic device may include the flexible substrates partially bent in the Z-axis direction, and thus the relatively limited inner space may be efficiently used. For example, the space facing the Z-axis direction in the inner space of the electronic device may be used. Furthermore, the electronic device may include the bracket structure mechanically constraining the flexible substrates. Accordingly, the shapes of the flexible substrates may be specified and may be used for design and control. In addition, the electronic device may include the flexible substrates and the connectors having relatively reduced sizes. Accordingly, an assembly process may be improved, and manufacturing cost may be reduced.

In addition, the disclosure may provide various effects that are directly or indirectly recognized.

DESCRIPTION OF DRAWINGS

The above and other aspects, features, and advantages of certain embodiments of the present disclosure will be more apparent from the following detailed description, taken in conjunction with the accompanying drawings, in which.

In the following description made with respect to the accompanying drawings, similar components will be assigned with similar reference numerals.

DETAILED DESCRIPTION

Hereinafter, various example embodiments of the disclosure may be described with reference to accompanying drawings. Accordingly, those of ordinary skill in the art will recognize that various modifications, equivalents, and/or alternatives on the various example embodiments described herein can be variously made without departing from the scope and spirit of the disclosure.

Figure 1A:
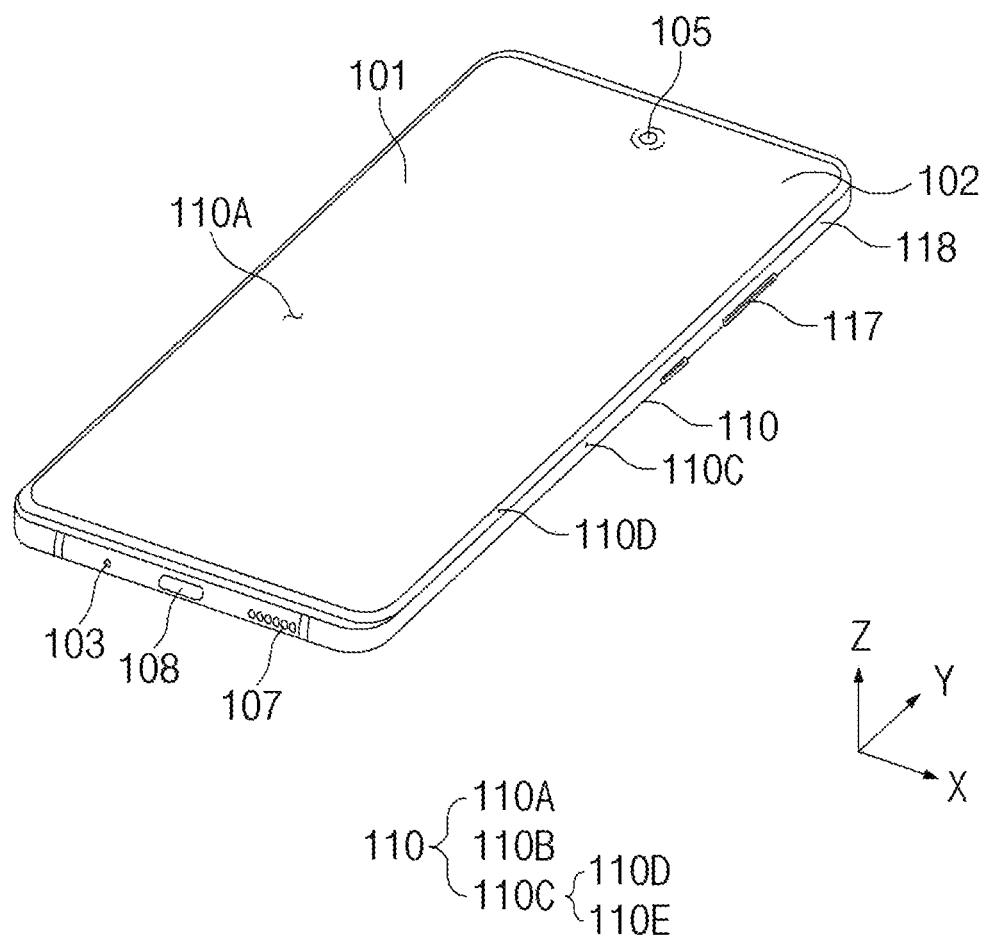
FIG. 1A is a front perspective view of an electronic device according to various embodiments.
Figure 1B:
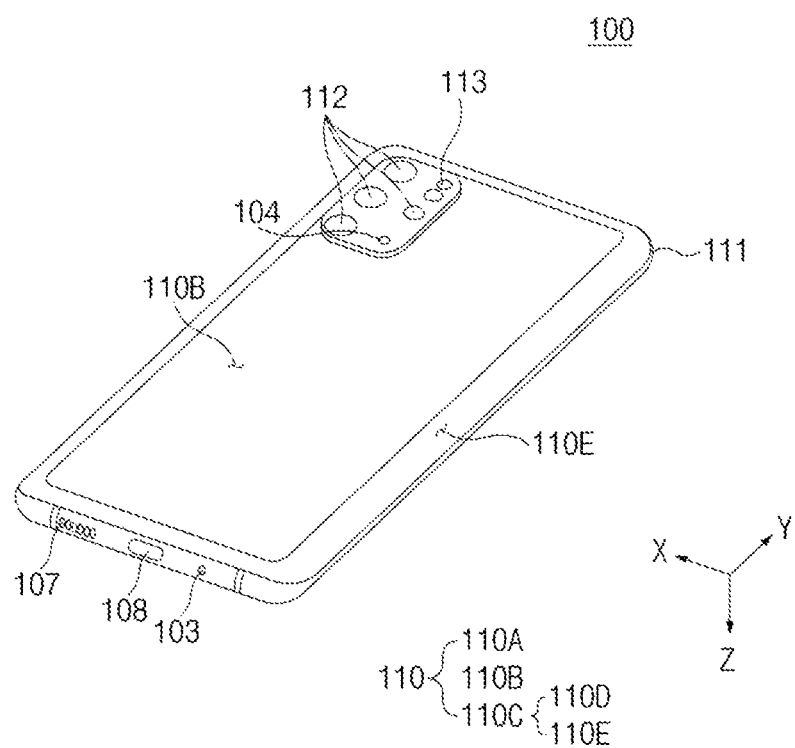
FIG. 1B is a rear perspective view of the electronic device according to various embodiments.

FIG. 1A is a front perspective view of an electronic device according to various embodiments. FIG. 1B is a rear perspective view of the electronic device according to various embodiments.

Referring to FIGS. 1A and 1B, the electronic device 100 may include a housing 110 that includes a first surface (or, a front surface) 110A, a second surface (or, a rear surface) 110B, and a side surface (e.g., frame) 110C surrounding a space between the first surface 110A and the second surface 110B. In an embodiment (not illustrated), the housing 110 may refer to a structure that forms some of the first surface 110A, the second surface 110B, and the side surface 110C.

According to an embodiment, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surface 110C may be formed by a side bezel structure (e.g., a "frame structure") 118 that is coupled with the front plate 102 and the back plate 111 and that contains metal and/or polymer. In an embodiment, the back plate 111 and the side bezel structure 118 may be integrally formed with each other and may contain the same material (e.g., a metallic material such as aluminum).

In the illustrated embodiment, the front plate 102 may include two first areas 110D that curvedly and seamlessly extend from partial areas of the first surface 110A toward the back plate 111. The first areas 110D may be located at opposite long edges of the front plate 102.

In the illustrated embodiment, the back plate 111 may include two second areas 110E that curvedly and seamlessly extend from partial areas of the second surface 110B toward the front plate 102. The second areas 110E may be located at opposite long edges of the back plate 111.

In an embodiment, the front plate 102 (or, the back plate 111) may include only one of the first areas 110D (or, the second areas 110E). Furthermore, in an embodiment, the front plate 102 (or, the back plate 111) may not include a part of the first areas 110D (or, the second areas 110E).

In an embodiment, when viewed from a side of the electronic device 100, the side bezel structure 118 may have a first thickness (or, width) at sides (e.g., short sides) not including the first areas 110D or the second areas 110E and may have a second thickness at sides (e.g., long sides) including the first areas 110D or the second areas 110E, the second thickness being smaller than the first thickness.

In an embodiment, the electronic device 100 may include at least one of a display 101, an audio module 103, 104, and 107, a sensor module (not illustrated), camera modules 105, 112, and 113, key input devices 117, a light emitting element (not illustrated), and/or a connector hole 108. In an embodiment, the electronic device 100 may not include at least one component (e.g., the key input devices 117 or the light emitting element (not illustrated)) among the aforementioned components, or may additionally include other component(s).

In an embodiment, the display 101 may be exposed through most of the front plate 102. For example, at least part of the display 101 may be exposed through the front plate 102 that includes the first surface 110A and the first areas 110D of the side surface 110C.

In an embodiment, the periphery of the display 101 may be formed to be substantially the same as the shape of the adjacent outside edge of the front plate 102. In an embodiment (not illustrated), the gap between the periphery of the display 101 and the periphery of the front plate 102 may be substantially constant to expand the area by which the display 101 is exposed.

In an embodiment, a surface of the housing 110 (or, the front plate 102) may include a display area that is formed as the display 101 is viewable. For example, the display area may include the first surface 110A and the first areas 110D of the side surface 110C.

In an embodiment (not illustrated), the display area 110A and 110D may include a sensing area (not illustrated) that is configured to obtain biometric information of a user. Here, when the display area 110A and 110D includes the sensing area, this may refer to at least part of the sensing area overlapping the display area 110A and 110D. For example, the sensing area (not illustrated) may refer to an area capable of displaying visual information of the display 101 like the other areas of the display area 110A and 110D and additionally obtaining biometric information (e.g., a fingerprint) of the user.

In an embodiment (not illustrated), the display 101 may be coupled with, or disposed adjacent to, touch detection circuitry, a pressure sensor for measuring the intensity (pressure) of a touch, and/or a digitizer for detecting a stylus pen of a magnetic type.

In an embodiment, the audio module 103, 104, and 107 may include the microphone holes 103 and 104 and the speaker hole 107.

In an embodiment, the microphone holes 103 and 104 may include the first microphone hole 103 formed in a partial area of the side surface 110C and the second microphone hole 104 formed in a partial area of the second surface 110B. A microphone for obtaining an external sound may be disposed in the microphone holes 103 and 104. The microphone may include a plurality of microphones to detect the direction of a sound. In an embodiment, the second microphone hole 104 formed in the partial area of the second surface 110B may be disposed adjacent to the camera modules 105, 112, and 113. For example, the second microphone hole 104 may obtain sounds when the camera modules 105, 112, and 113 are executed, or may obtain sounds when other functions are executed.

In an embodiment, the speaker hole 107 may include an external speaker hole 107 and a receiver hole for telephone call (not illustrated). The external speaker hole 107 may be formed in one portion of the side surface 110C of the electronic device 100. In an embodiment, the external speaker hole 107 and the microphone hole 103 may be implemented as a single hole. Although not illustrated, the receiver hole for telephone call (not illustrated) may be formed in another portion of the side surface 110C. For example, the receiver hole for telephone call (not illustrated) may be formed in a portion (e.g., a portion facing the +Y-axis direction) of the side surface 110C that faces the portion (e.g., a portion facing the −Y-axis direction) of the side surface 110C in which the external speaker hole 107 is formed.

In an embodiment, the electronic device 100 may include a speaker in communication with the speaker hole 107. In an embodiment, the speaker may include a piezoelectric speaker not including the speaker hole 107.

In an embodiment, the sensor module (not illustrated) may generate an electrical signal or a data value that corresponds to an operational state inside the electronic device 100 or an environmental state external to the electronic device 100. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

In an embodiment, the key input devices 117 may be disposed on the side surface 110C (e.g., the first areas 110D and/or the second areas 110E) of the housing 110. In an embodiment, the electronic device 100 may not include all or some of the key input devices 117, and the key input devices 117 not included may be implemented in a different form, such as a soft key, on the display 101. In an embodiment, the key input devices 117 may include a sensor module (not illustrated) that forms the sensing area (not illustrated) that is included in the display area 110A and 110D.

In an embodiment, the connector hole 108 may accommodate a connector. The connector hole 108 may be disposed in the side surface 110C of the housing 110. For example, the connector hole 108 may be disposed in the side surface 110c so as to be adjacent to at least part of the audio module (e.g., the microphone hole 103 and the speaker hole 107). In an embodiment, the electronic device 100 may include the first connector hole 108 that accommodates a connector (e.g., a USB connector) for transmitting/receiving power and/or data with an external electronic device, and/or a second connector hole (not illustrated) that accommodates a connector (e.g., an earphone jack) for transmitting/receiving audio signals with an external electronic device.

In an embodiment, the electronic device 100 may include the light emitting element (not illustrated). For example, the light emitting element (not illustrated) may be disposed on the first surface 110A of the housing 110. The light emitting element (not illustrated) may provide state information of the electronic device 100 in the form of light. In an embodiment, the light emitting element (not illustrated) may provide a light source that operates in conjunction with operation of the camera module 105. For example, the light emitting element (not illustrated) may include an LED, an IR LED, and/or a xenon lamp.

In an embodiment, the camera modules 105, 112, and 113 may include the first camera module 105 (e.g., an under display camera) configured to receive light through a camera area of the first surface 110A of the electronic device 100, the second camera module 112 exposed on the second surface 110B, and the flash 113.

Figure 2A:
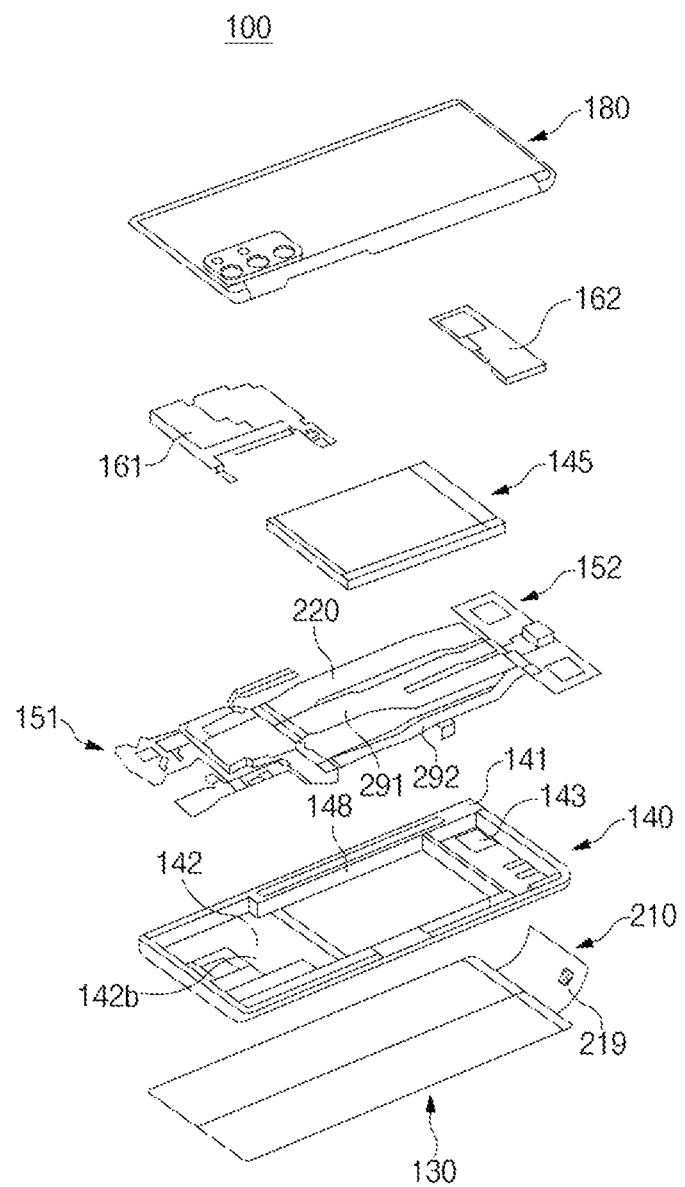
FIG. 2A is an exploded perspective view of the electronic device according to various embodiments.
Figure 2B:
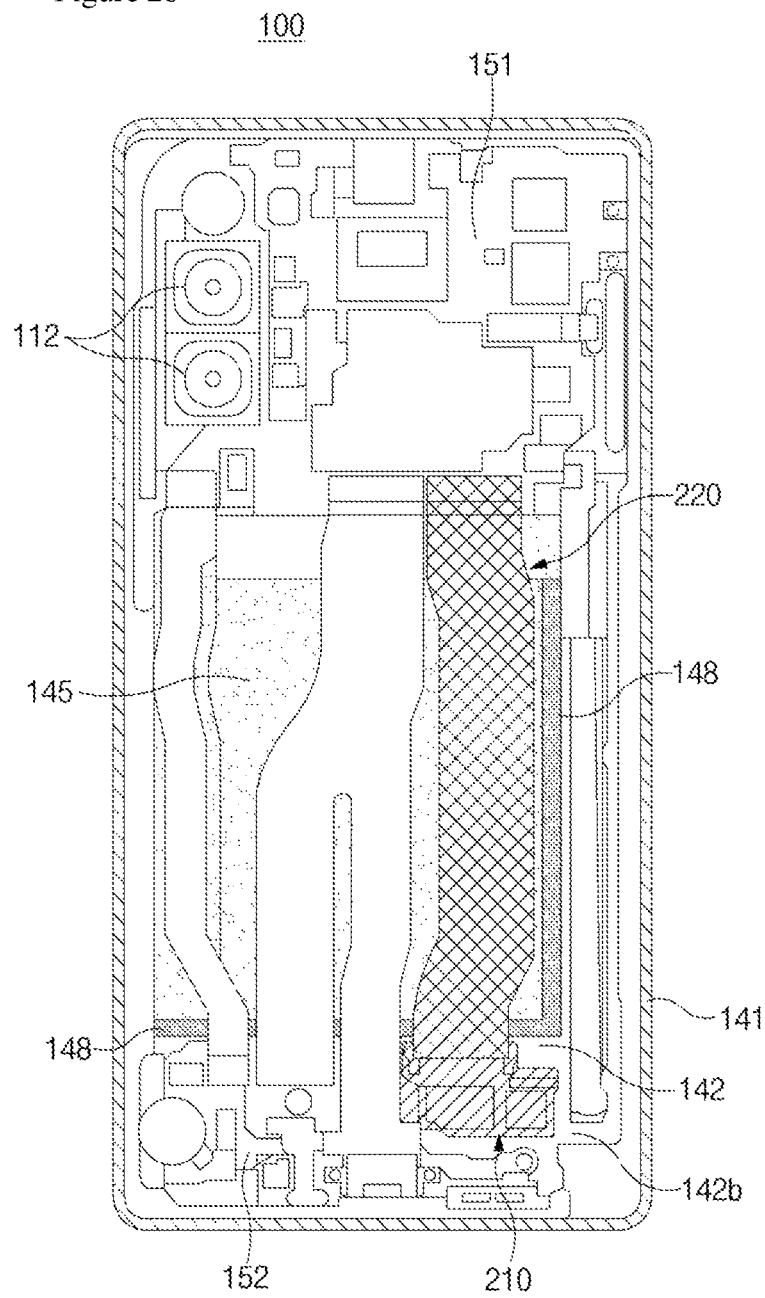
FIG. 2B is a diagram illustrating a rear side of the electronic device according to various embodiments.

FIG. 2A is an exploded perspective view of the electronic device according to various embodiments. FIG. 2B is a diagram illustrating a rear side of the electronic device according to various embodiments. FIG. 2B is a view in which a back plate 180 is omitted from the electronic device illustrated in FIG. 2A.

Referring to FIGS. 2A and 2B, the electronic device 100 may include the back plate 180, support members 161 and 162 (e.g., a rear case), a battery 145, a first circuit board 151, a second circuit board 152, a first flexible substrate 210, a second flexible substrate 220, a third flexible substrate 291, a fourth flexible substrate 292, a housing 140 (e.g., a front case), and a display module 130 (e.g., the display 101 of FIG. 1A). In an embodiment, the electronic device 100 may not include at least one of the aforementioned components, or may additionally include other component(s). At least one of the components of the electronic device 100 may be identical or similar to at least one of the components of the electronic device 100 of FIGS. 1A and 1B, and repetitive descriptions may not be repeated here.

In an embodiment, the housing 140 may include a plate structure (e.g., a plate) 142 and a frame structure (e.g., a frame) 141. The plate structure 142 may have the first circuit board 151, the second circuit board 152, a camera module 112, and the battery 145 disposed on one surface thereof. The plate structure 142 may have the display module 130 disposed on an opposite surface thereof. The frame structure 141 may surround the plate structure 142. In various embodiments, the plate structure 142 and the frame structure 141 may be integrally formed with each other, or may be detachably connected with each other as separate structures. The frame structure 141 may form a portion (e.g., a side surface) of a surface of the electronic device 100. In various embodiments, the frame structure 141, the display module 130, and the back plate 180 may form a housing (e.g., the housing 110 of FIGS. 1A and 1B).

In an embodiment, the first circuit board 151 and the second circuit board 152 may be disposed on the plate structure 142 of the housing 140. The first circuit board 151 may be located adjacent to the camera module 112. The first circuit board 151 and the second circuit board 152 may be disposed with the battery 145 therebetween. The second circuit board 152 may have an external interface module disposed thereon.

In an embodiment, the first circuit board 151 may have a processor disposed thereon. The processor may be electrically connected, through the first flexible substrate 210 and the second flexible substrate 220, with a display driver IC 219 disposed on the first flexible substrate 210. In various embodiments, the processor and/or the display driver IC 219 may drive the display module 130.

In an embodiment, the third flexible substrate 291 and the fourth flexible substrate 292 may electrically connect the first circuit board 151 and the second circuit board 152. At least part of the third flexible substrate 291 and at least part of the fourth flexible substrate 292 may extend into a space between the battery 145 and the back plate 180.

In an embodiment, an interface may include, for example, a high definition multimedia interface (HDMI), a universal serial bus (USB) interface, an SD card interface, and/or an audio interface. For example, the interface may electrically or physically connect the electronic device 100 with an external electronic device and may include a USB connector, an SD card/MMC connector, or an audio connector. In an embodiment, the interface may be disposed on the second circuit board 152.

In an embodiment, the battery 145 may supply power to at least one of the components of the electronic device 100. For example, the battery 145 may include a primary cell that is not rechargeable, a secondary cell that is rechargeable, or a fuel cell. In an embodiment, at least part of the battery 125 may be disposed on substantially the same plane as the first circuit board 151 and the second circuit board 152. In an embodiment, the battery 145 may be integrally disposed inside the electronic device 100, or may be disposed so as to be detachable from the electronic device 100.

In an embodiment, the display module 130 may form at least part of the surface (e.g., the front surface) of the electronic device 100. The display module 130 may include a plurality of layers. A part of the plurality of layers may include the front plate that forms the surface of the electronic device 100. The display module 130 may be electrically connected with the first circuit board 151 through the first flexible substrate 210 and the second flexible substrate 220. For example, the first flexible substrate 210 may extend to a second surface 142b of the plate structure 142 through an opening area 143 formed in the plate structure 142 and may be connected with the second flexible substrate 220.

In an embodiment, the first flexible substrate 210 may extend from an edge of the display module 130. For example, the first flexible substrate 210 may include a layer extending from at least one of the plurality of layers included in the display module 130. In an embodiment, at least part of the first flexible substrate 210 may be formed to be flexible. In an embodiment, an electric element related to driving the display module 130 may be disposed on the first flexible substrate 210. For example, the display driver IC 219 may be disposed on the first flexible substrate 210. In an embodiment, the first flexible substrate 210 may extend to the second surface 142b of the plate structure 142 through the opening area 143 formed in the plate structure 142. For example, at least part of the first flexible substrate 210 may be located in the opening area 143. The first flexible substrate 210 may be connected, on the second surface 142b of the plate structure 142, with the second flexible substrate 220.

In an embodiment, the second flexible substrate 220 may extend from the first circuit board 151 across the battery 145. For example, the second flexible substrate 220 may connect the first circuit board 151 located on one side of the battery 145 and the first flexible substrate 210 located on an opposite side of the battery 145. The first flexible substrate 210 and the second flexible substrate 220 may be fastened with each other on the opposite side of the battery 145.

Figure 3:
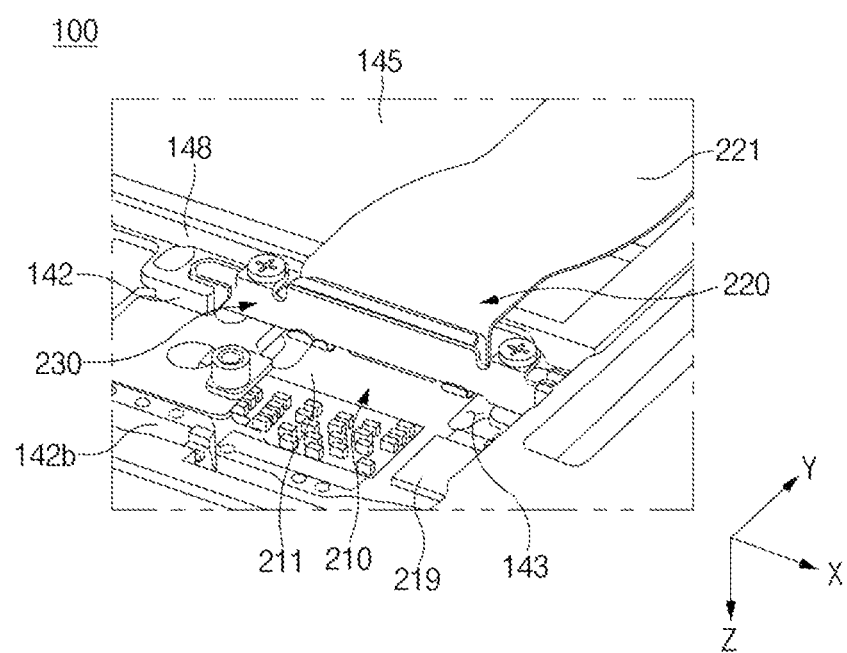
FIG. 3 is a perspective view illustrating a first flexible substrate and a second flexible substrate of the electronic device according to various embodiments.

FIG. 3 is a perspective view illustrating the first flexible substrate and the second flexible substrate of the electronic device according to various embodiments.

Referring to FIG. 3, the electronic device 100 may include a battery frame 148 surrounding the battery 145 and a bracket structure 230 fixing a first connector (e.g., a first connector 214 of FIG. 4) of the first flexible substrate 210 and a second connector (e.g., a second connector 224 of FIG. 4) of the second flexible substrate 220. The battery frame 148 may be formed on the second surface 142b of the plate structure 142 and may protrude from the second surface 142b in the −Z-axis direction. The opening area 143 may be formed through an area of the plate structure 142 that is adjacent to the battery frame 148.

In an embodiment, the first flexible substrate 210 may be exposed on the second surface 142b of the plate structure 142 through the opening area 143. For example, at least part of the first flexible substrate 210 may be located in the opening area 143. The display driver IC 219 may be disposed on the first flexible substrate 210. The first flexible substrate 210 may include the first connector 214 (e.g., the first connector 214 of FIG. 4) that is coupled to the second flexible substrate 220.

In an embodiment, the second flexible substrate 220 may extend from the first circuit board 151 to the first flexible substrate 210 across the battery 145 and the battery frame 148. The second flexible substrate 220 may include the second connector 224 (e.g., the second connector 224 of FIG. 4) that is coupled to the first flexible substrate 210.

In an embodiment, the first flexible substrate 210 and the second flexible substrate 220 may electrically connect the display module 130 and the first circuit board 151.

In an embodiment, the bracket structure 230 may be fixedly disposed on the plate structure 142. For example, the bracket structure 230 may include fixing portions extending from the bracket structure 230 in opposite directions, and the fixing portions may be accommodated in recesses formed on the plate structure 142. Alternatively, in various embodiments, the bracket structure 230 may be screw-coupled to the plate structure 142.

Figure 4:
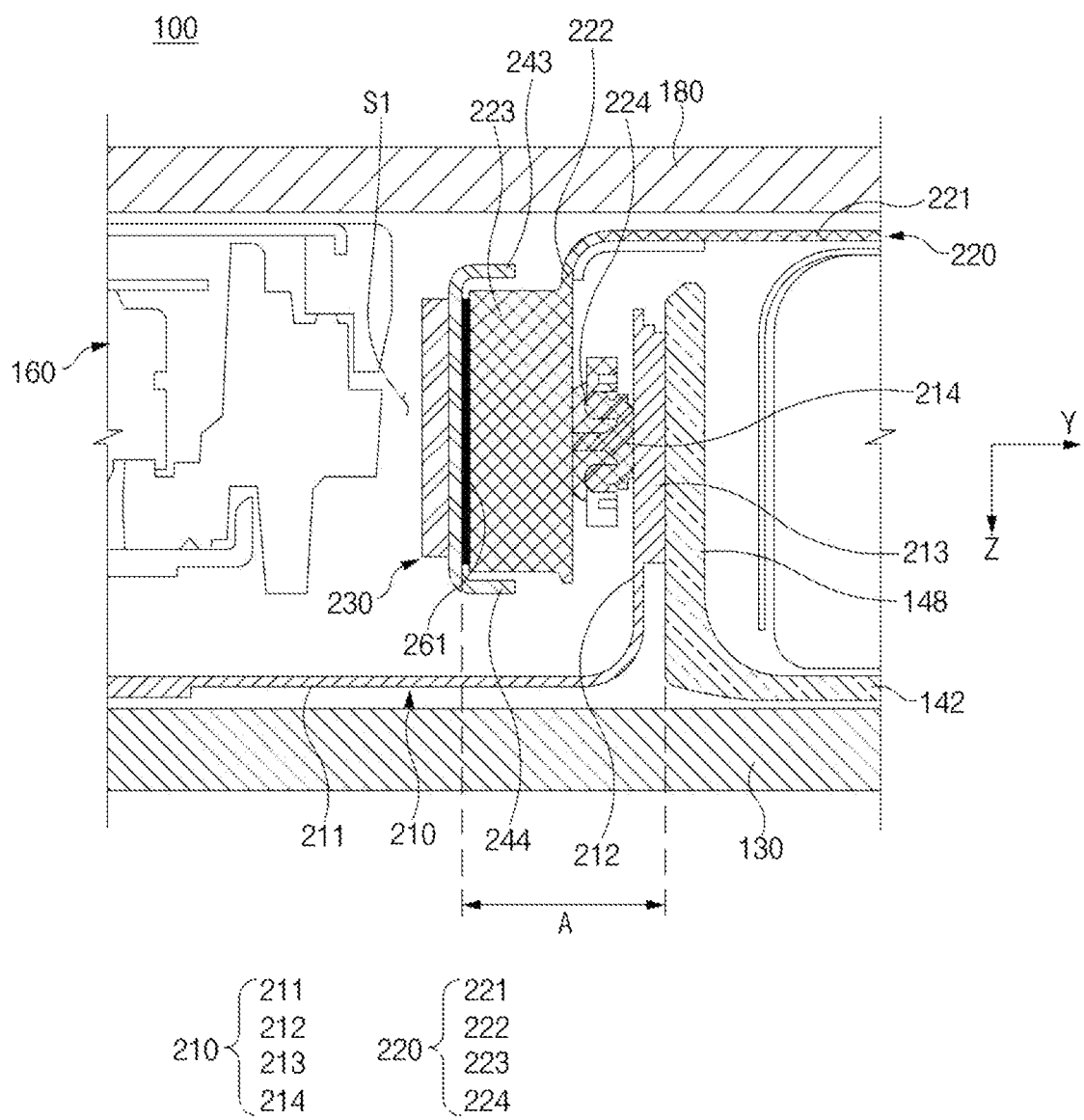
FIG. 4 is a cross-sectional view of the electronic device according to various embodiments.

FIG. 4 is a cross-sectional view of the electronic device according to various embodiments.

In an embodiment, the back plate 180 may include a planar area facing the −Z-axis direction. The display module 130 may include a planar area facing the Z-axis direction. In an embodiment, the battery 145, at least part of the first flexible substrate 210, the second flexible substrate 220, and an internal structure 160 may be disposed in a space between the plate structure 142 and the back plate 180. In an embodiment, when viewed in a direction perpendicular to the Z-axis, the first connector 214 of the first flexible substrate 210, the second connector 224 of the second flexible substrate 220, and the bracket structure 230 may be disposed in a first space S1 between the internal structure 160 and the battery frame 148. In an embodiment, the internal structure 160 may include support members (e.g., the support members 161 and 162 of FIG. 2A). An opening area (e.g., the opening area 143 of FIG. 2A) may be formed in the plate structure 142. The first flexible substrate 210 may extend from the display module 130 through the opening area 143 such that at least part of the first flexible substrate 210 is located in the first space S1.

In an embodiment, the first flexible substrate 210 may include a first area 211 and a second area 212 extending from the first area 211. In an embodiment, the first area 211 and the second area 212 may extend in different directions. For example, the first area 211 and the second area 212 may face directions substantially perpendicular to each other. In an embodiment, the second area 212 may be bent from the first area 211. For example, part of the first area 211 and/or part of the second area 212 may be curved. In an embodiment, the first area 211 may extend from the display module 130 and may include an area located on the second surface (e.g., the second surface 142b of FIG. 3) of the plate structure 142 through the opening area 143 or exposed on the second surface 142b of the plate structure 142 through the opening area 143. In an embodiment, the first area 211 may include an area facing substantially the Z-axis direction. In an embodiment, the second area 212 may include an area facing a fourth area 222 of the second flexible substrate 220. For example, the second area 212 may include an area facing the direction perpendicular to the Z-axis (e.g., the Y-axis direction of FIGS. 2A and 2B). In an embodiment, the second area 212 may include a first stiffener 213 and the first connector 214. The first stiffener 213 may be formed of a material having a specified stiffness to increase the strength of the first flexible substrate 210. In various embodiments, the first stiffener 213 may be disposed on the second area 212 of the first flexible substrate 210 to face the first connector 214 with the second area 212 therebetween. In an embodiment, the first connector 214 may be physically coupled with the second connector 224. For example, the first connector 214 may be coupled with the second connector 224 in the direction perpendicular to the Z-axis (e.g., the Y-axis direction of FIGS. 2A and 2B).

Referring to FIG. 4, the second area 212 of the first flexible substrate 210 may be attached to the battery frame 148. For example, the first stiffener 213 may be attached to the battery frame 148. For example, the first stiffener 213 may be attached to the battery frame 148 through an adhesive member (e.g., a double-sided adhesive tape). In an embodiment, the first connector 214 of the first flexible substrate 210 and the second connector 224 of the second flexible substrate 220 may be located between the bracket structure 230 and the battery frame 148. In the illustrated embodiment, the second area 212 of the first flexible substrate 210 may be disposed closer to the battery frame 148 than the fourth area 222 of the second flexible substrate 220.

In an embodiment, the second flexible substrate 220 may include a third area 221 and the fourth area 222 extending from the third area 221. In an embodiment, the third area 221 and the fourth area 222 may extend in different directions. For example, the third area 221 and the fourth area 222 may face directions substantially perpendicular to each other. In an embodiment, the third area 221 may be bent from the fourth area 222. For example, part of the fourth area 222 may be curved. In an embodiment, the third area 221 may extend from the first circuit board (e.g., the first circuit board 151 of FIGS. 2A and 2B). In an embodiment, the third area 221 may include an area facing substantially the Z-axis direction. In an embodiment, the fourth area 222 may include an area facing the second area 212 of the first flexible substrate 210. For example, the fourth area 222 may include an area facing the direction perpendicular to the Z-axis (e.g., the Y-axis direction of FIGS. 2A and 2B). In an embodiment, the fourth area 222 may include a second stiffener 223 and the second connector 224. The second stiffener 223 may be formed of a material having a specified stiffness to increase the strength of the second flexible substrate 220. In various embodiments, the second stiffener 223 may be disposed on the fourth area 222 of the second flexible substrate 220 to face the second connector 224 with the fourth area 222 therebetween. In an embodiment, the second connector 224 may be physically coupled with the first connector 214. For example, the second connector 224 may be coupled with the first connector 224 in the direction perpendicular to the Z-axis (e.g., the Y-axis direction of FIGS. 2A and 2B).

Referring to FIG. 4, the fourth area 222 of the second flexible substrate 220 may be attached to the bracket structure 230. For example, the second stiffener 223 of the second flexible substrate 220 may be attached to the bracket structure 230. For example, the second stiffener 223 may be attached to the bracket structure 230 through an adhesive member (e.g., a double-sided adhesive tape) 261. In an embodiment, the fourth area 222 of the second flexible substrate 220 may be spaced apart from the battery frame 148 by a predetermined gap and may face the battery frame 148. In an embodiment, the bracket structure 230 may include bending portions 243 and 244 for constraining the position of the second flexible substrate 220. The bending portions 243 and 244 may extend toward the battery frame 148 to surround at least part of the second stiffener 223.

Referring to FIG. 4, when viewed in the Z-axis direction, the first flexible substrate 210 and the second flexible substrate 220 may at least partially overlap each other. For example, when viewed from the rear (e.g., the −Z-axis direction) as illustrated in FIG. 2B, overlapping areas A of the first flexible substrate 210 and the second flexible substrate 220 may overlap each other in the Y-axis direction. The overlapping areas A may serve to ensure a space in which the first flexible substrate 210 and the second flexible substrate 220 are able to be bent in the limited inner space of the electronic device 100. For example, when the first flexible substrate 210 and the second flexible substrate 220 are bent with relatively large curvatures, the first flexible substrate 210 and the second flexible substrate 220 may be cracked. To enable the first flexible substrate 210 and the second flexible substrate 220 to be bent with relatively small curvatures, the first flexible substrate 210 may further extend in a first direction (e.g., the Y-axis direction), and the second flexible substrate 220 may further extend in a second direction (e.g., the −Y-axis direction) opposite to the first direction. Accordingly, cracks in the first flexible substrate 210 and the second flexible substrate 220 may be reduced.

Furthermore, the electronic device 100 according to various embodiments may be configured such that the first connector 214 and the second connector 224 are not disengaged from each other when an external force (e.g., repulsive forces of the flexible substrates 210 and 220 or a drop impact) acts. For example, tension (e.g., a pulling force in the −Y-axis direction) may act on the first flexible substrate 210 from the display module 130, and tension (e.g., a pulling force in the Y-axis direction) may act on the second flexible substrate 220 from the first circuit board 151. According to the embodiment illustrated in FIG. 4, the first connector 214 and the second connector 224 may be substantially coupled with each other in the directions of the tensions. Accordingly, the first connector 214 and the second connector 224 may be firmly coupled by the tensions without being disengaged from each other.

The first flexible substrate 210 and the second flexible substrate 220 of the electronic device 100 according to various embodiments may be configured such that the connectors 214 and 224 are coupled with each other in the direction perpendicular to the Z-axis. That is, the direction (e.g., the Y-axis direction) in which the connectors 214 and 224 are coupled may be in agreement with the main directions of the tensions acting on the first flexible substrate 210 and the second flexible substrate 220, and thus a risk of damage to the connectors 214 and 224 may be reduced by the tensions. Furthermore, the first flexible substrate 210 and the second flexible substrate 220 may use a space of the electronic device 100 that faces the Z-axis direction, and thus the limited inner space may be more efficiently used.

Figure 5A:
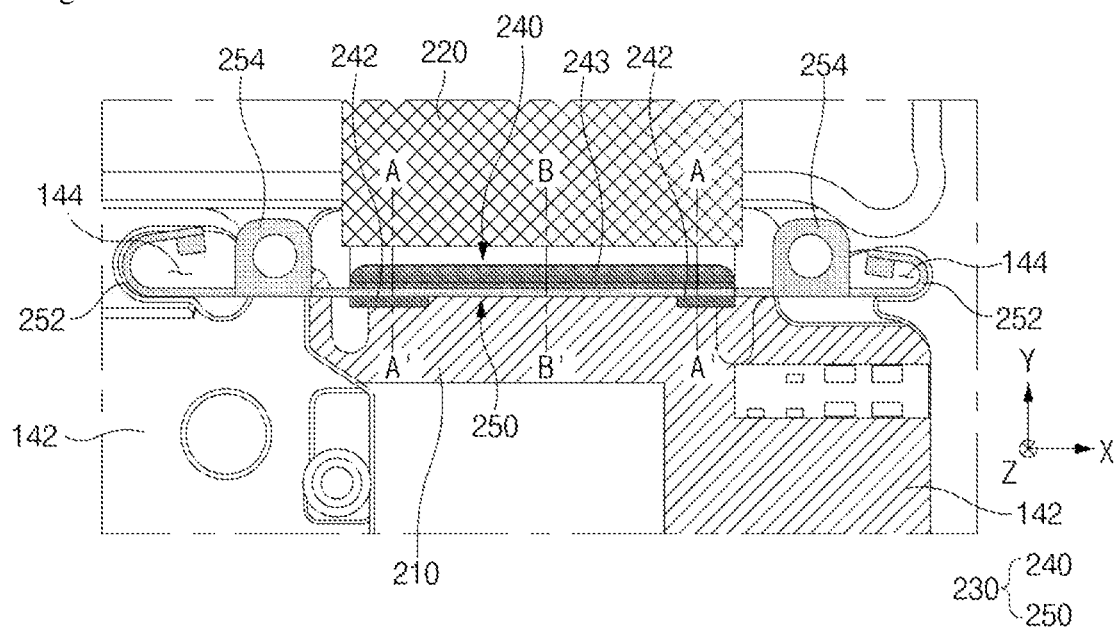
FIGS. 5A and 5B are cross-sectional views illustrating the first flexible substrate, the second flexible substrate, and a bracket structure of the electronic device according to various embodiments.
Figure 5B:
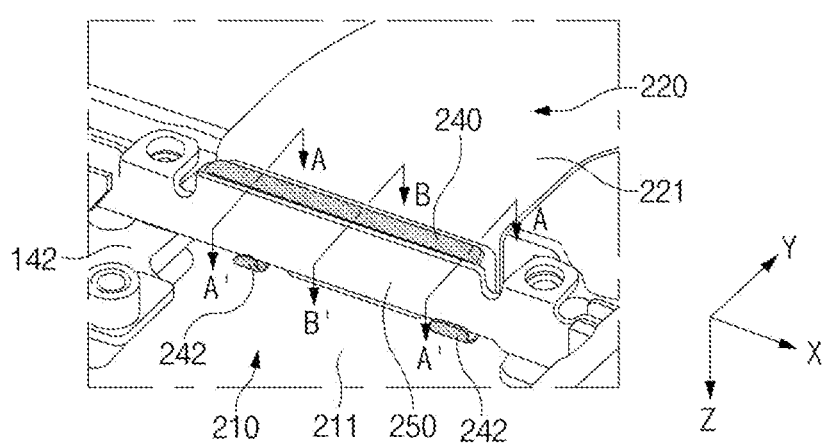
Figure 6:
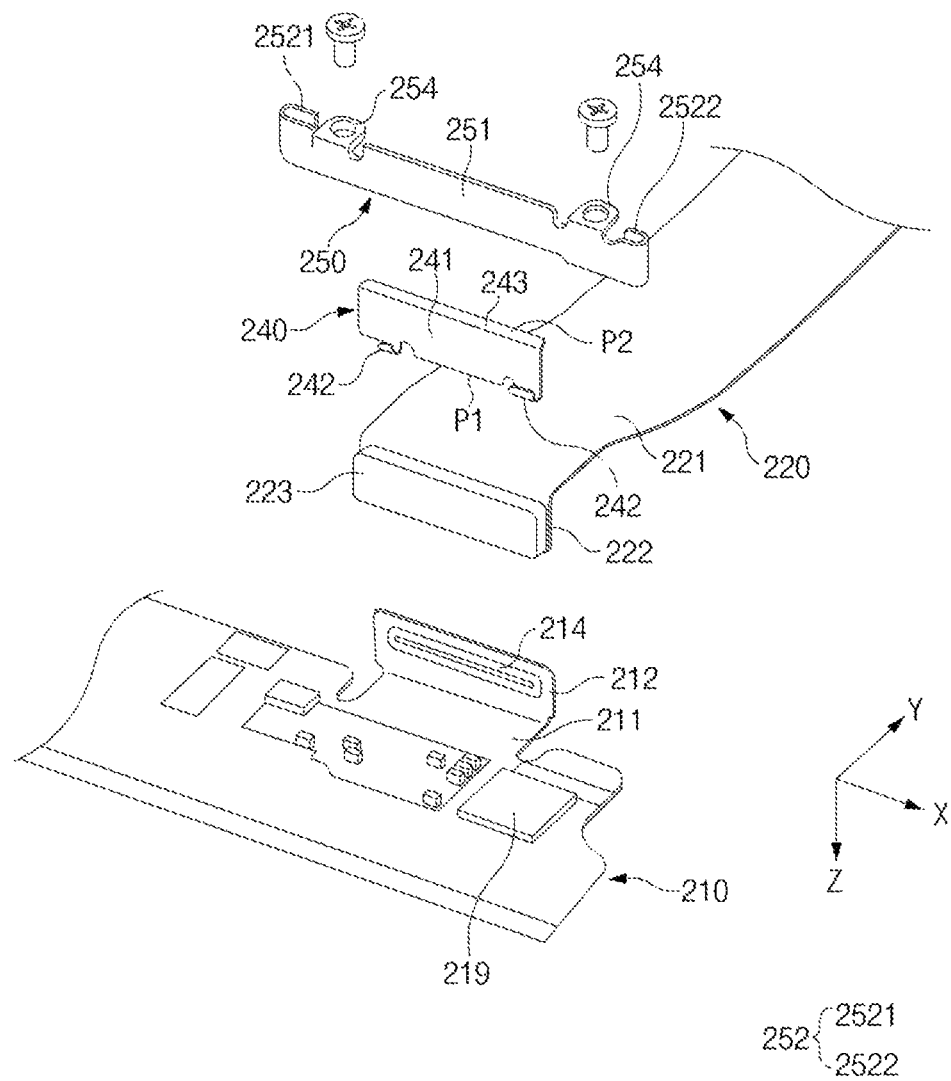
FIG. 6 is an exploded perspective view illustrating the first flexible substrate, the second flexible substrate, and the bracket structure of the electronic device according to various embodiments.

FIGS. 5A and 5B are views illustrating the first flexible substrate, the second flexible substrate, and the bracket structure of the electronic device according to various embodiments. FIG. 6 is an exploded perspective view illustrating the first flexible substrate, the second flexible substrate, and the bracket structure of the electronic device according to various embodiments.

In an embodiment, the bracket structure 230 may include a first bracket 240 and a second bracket 250.

In an embodiment, the first bracket 240 may be coupled to the second flexible substrate 220. The first bracket 240 may be coupled to the second bracket 250. For example, the first bracket 240 may be fixed to the plate structure 142 through the second bracket 250.

In an embodiment, the first bracket 240 may include a first plate 241 facing the second stiffener 223, hook portions 242 formed at a first edge P1 of the first plate 241, and the bending portion(s) 243 formed at the first edge P1 and/or a second edge P2 of the first plate 241.

In an embodiment, the first plate 241 may be formed of a flat plate facing substantially the Y-axis direction (e.g., the direction toward the battery frame 148 of FIGS. 5A and 5B). The second stiffener 223 may be attached to the first plate 241 through an adhesive member. In an embodiment, the first plate 241 may be located between the second stiffener 223 of the second flexible substrate 220 and a second plate 251 of the second bracket 250. In an embodiment, the first edge P1 of the first plate 241 may be closer to the plate structure 142 than the second edge P2 of the first plate 241. For example, the second edge P2 may be located in the −Z-axis direction with respect to the first edge P1. For example, the first edge P1 and the second edge P2 of the first plate 241 may be edges substantially parallel to the X-axis direction. In an embodiment, the hook portions 242 may be bent from the first edge P1 of the first plate 241 to surround part of the second plate 251 of the second bracket 250. The hook portions 242 may support the second plate 251 of the second bracket 250 in the −Z-axis direction. In an embodiment, the bending portions 243 may extend from the first edge P1 and the second edge P2 of the first plate 241 in the +Y-axis direction and may cover part of the second stiffener 223 of the second flexible substrate 220. For example, the first bracket 240 may be formed in the shape of "c". For example, the bending portions 243 may be located in the +Z/−Z-axis directions with respect to the second stiffener 223 of the second flexible substrate 220.

In an embodiment, the second bracket 250 may include the second plate 251 that faces the first plate 241 of the first bracket 240 and fixing portions 252 (e.g., including 2521, 2522) that extend from the second plate 251 in opposite directions and that fix the second bracket 250 to the plate structure 142. The fixing portions 252 may include a first fixing portion 2521 extending from the second plate 251 to one side (e.g., the left side in FIG. 6) and a second fixing portion 2522 extending from the second plate 251 to an opposite side (e.g., the right side in FIG. 6). In an embodiment, the second plate 251 may be formed to be substantially flat. For example, the second plate 251 may face a direction (e.g., the Y-axis direction) substantially perpendicular to the first plate 241 of the first bracket 240. Screw coupling portions 254 may be located between the second plate 251 and the fixing portions 252. In various embodiments, the screw coupling portions 254 are not limited to the positions illustrated in the drawings. For example, the screw coupling portions 254 may be located in the −X-axis direction from the first fixing portion 2521 and in the +X-axis direction from the second fixing portion 2522. In an embodiment, the first fixing portion 2521 and the second fixing portion 2522 may be accommodated in recesses 144 formed on the plate structure 142. Each of the first fixing portion 2521 and the second fixing portion 2522 may be formed such that one partial area faces another partial area in the Y-axis direction. In an embodiment, the first fixing portion 2521 and the second fixing portion 2522 may be fixed in the X-axis direction and the Y-axis direction by being accommodated in the recesses 144. In various embodiments, the first fixing portion 2521 and the second fixing portion 2522 may be formed to provide elastic forces to sidewalls of the recesses 144 and may be fixed in the Z-axis direction. Additionally, in various embodiments, the second bracket 250 may be screw-coupled to the plate structure 142. The second bracket 250 may be fixed to the plate structure 142 through the screw coupling portions 254.

Figure 7:
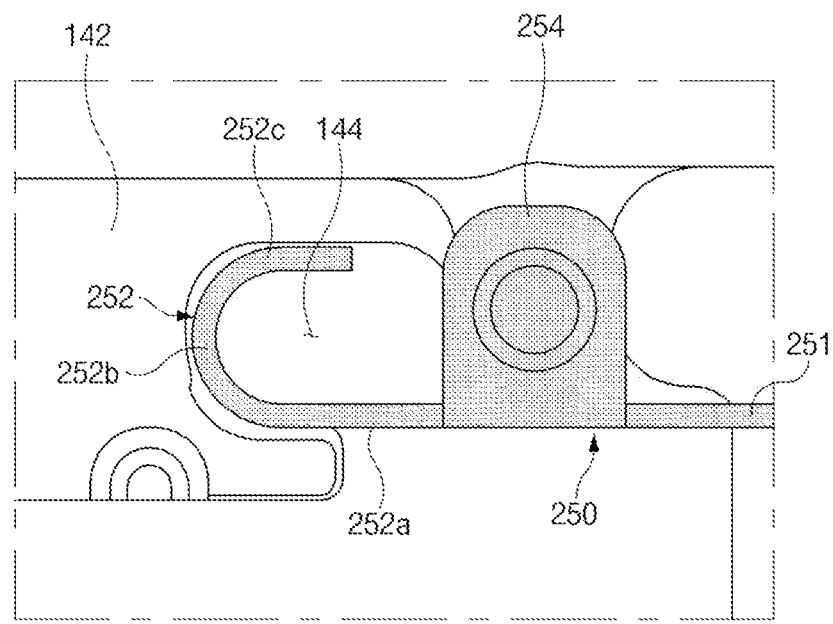
FIG. 7 is a cross-sectional view illustrating the bracket structure of the electronic device according to various embodiments.
Figure 8A:
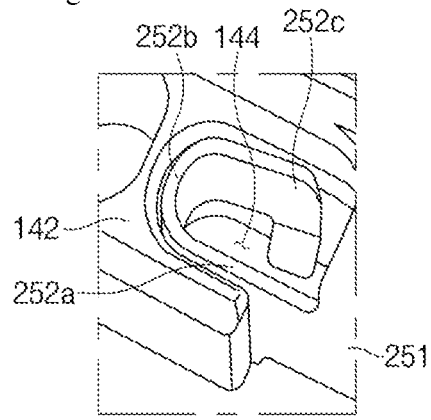
FIGS. 8A, 8B and 8C are perspective views illustrating the bracket structure of the electronic device according to various embodiments.
Figure 8B:
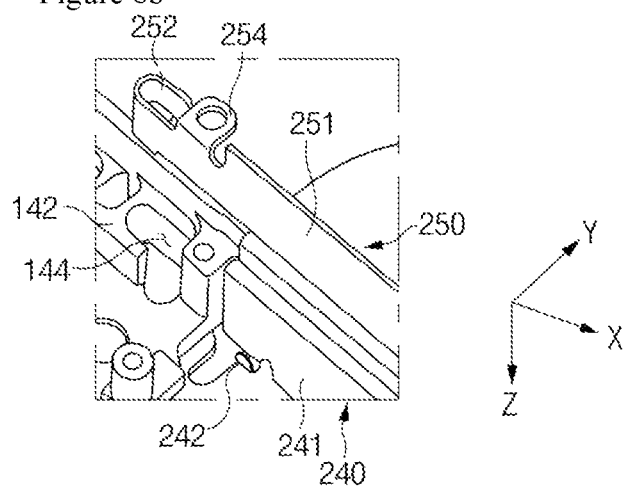
Figure 8C:
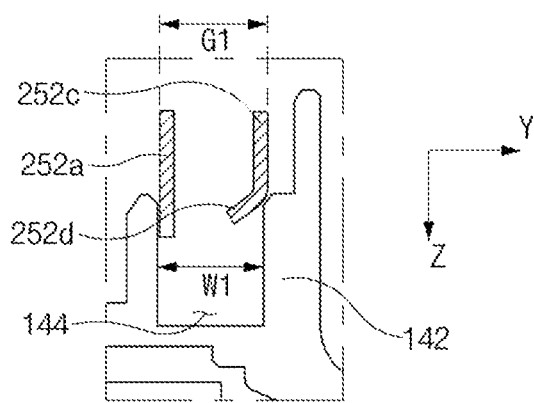

FIG. 7 is a cross-sectional view illustrating the bracket structure of the electronic device according to various embodiments. FIGS. 8A, 8B and 8C are views illustrating the bracket structure of the electronic device according to various embodiments.

Referring to FIGS. 7 and 8A, 8B and 8C, the second bracket 250 may include the second plate 251 coupled with the first bracket 240 and the fixing portions 252 coupled to the plate structure 142.

In an embodiment, each of the fixing portions 252 may include a first portion 252a extending from the second plate 251, a second portion 252b extending from the first portion 252a, and a third portion 252c extending from the second portion 252b and facing the first portion 252a.

In an embodiment, the first portion 252a and the third portion 252c may be formed to face each other. The second portion 252b may be bent to connect the first portion 252a and the third portion 252c. The first portion 252a, the second portion 252b, and the third portion 252c may be accommodated in the recess 144 of the plate structure 142. The first portion 252a and the third portion 252c may be disposed on sidewalls of the recess 144 facing each other.

In an embodiment, the fixing portion 252 may fix the second bracket 250 in the Y-axis direction. For example, the first portion 252a and the third portion 252c may face each other in the Y-axis direction and may make contact with the sidewalls of the recess 144. In an embodiment, the fixing portion 252 may fix the second bracket 250 in the X-axis direction. For example, the second portion 252b may make contact with a sidewall of the recess 144 in the X-axis direction. Accordingly, the fixing portion 252 may be accommodated in the recess 144 and may fix the second bracket 250 in the X-axis direction and the Y-axis direction.

Referring to FIGS. 8A, 8B and 8C, the fixing portion 252 of the second bracket 250 may be configured to additionally provide a constraint force in the Z-axis direction. For example, the fixing portion 252 may be disposed such that the first portion 252 and the third portion 252c provide elastic forces to the sidewalls of the recess 144. For example, forces may act on the first portion 252a and the third portion 252c in directions in which the first portion 252a and the third portion 252c move away from each other. For example, the recess 144 may have a first width W1 in the Y-axis direction, and the first portion 252a and the third portion 252c of the fixing portion 252, which are not coupled to the plate structure 142, may be spaced apart from each other by a first gap G1. The first gap G1 may be greater than the first width W1. In an embodiment, the first portion 252a and the third portion 252c of the fixing portion 252 may be located in the recess 144 in a state of being compressed to move toward each other. Accordingly, the third portion 252c may press the sidewall of the recess 144 in a direction away from the first portion 252a. The pressing of the sidewall of the recess 144 by the third portion 252c may more firmly fix the second bracket 250.

In an embodiment, the fixing portion 252 may further include a fourth portion 252d extending from the third portion 252c. In an embodiment, the fourth portion 252d may be obliquely formed to be inserted into the recess 144 along the sidewall of the recess 144 when the fixing portion 252 is inserted into the recess 144. For example, the fourth portion 252d may be obliquely formed such that the fixing portion 252 is compressed in the process in which the fixing portion 252 is inserted into the recess 144. For example, the fourth portion 252d may obliquely extend in the Z-axis direction and a direction toward the first portion 252a. For example, the fourth portion 252d may extend in the direction in which the fixing portion 252 is inserted into the recess 144 and the direction toward the first portion 252a.

In various embodiments, the second bracket 250 may be more firmly fixed through screws. The screw coupling portions 254 of the second bracket 250 may be located between the second plate 251 and the fixing portions 252. However, the shape, structure, and coupling relationship of the second bracket 250 of the electronic device 100 according to various embodiments are not limited to those illustrated in the drawings.

Figure 9A:
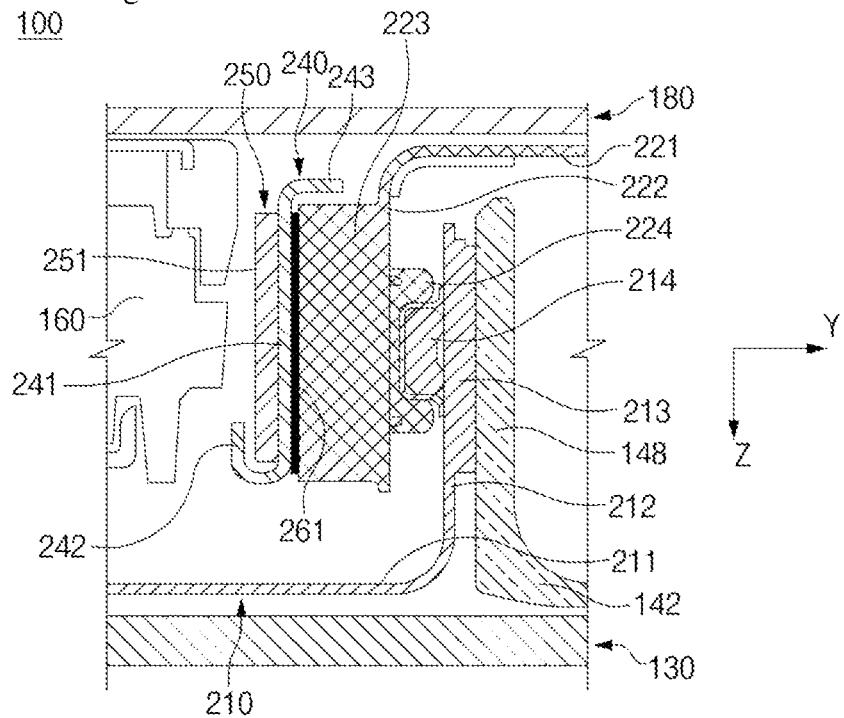
FIGS. 9A and 9B are cross-sectional views of the electronic device according to various embodiments.
Figure 9B:
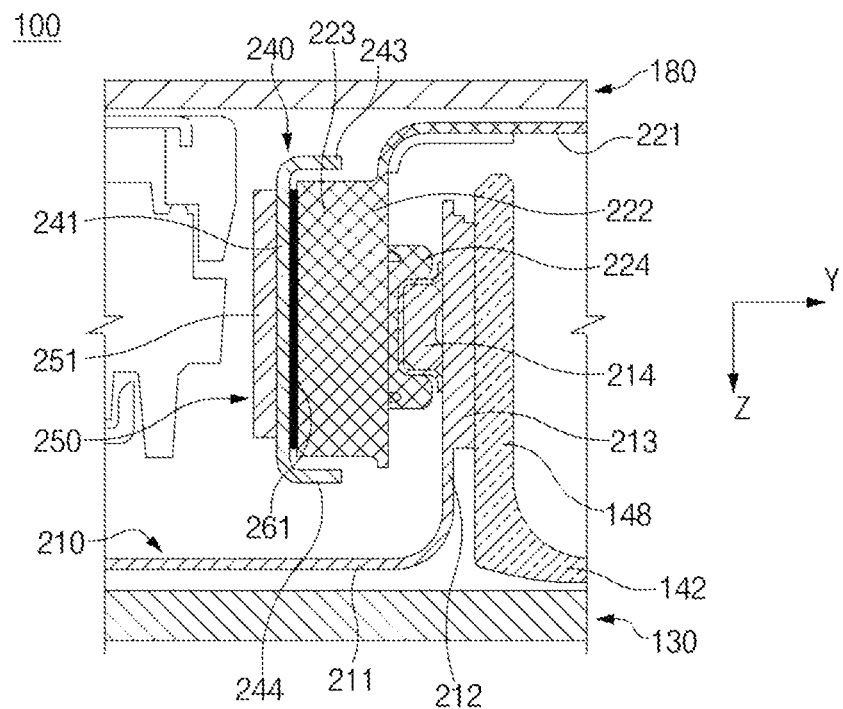

FIGS. 9A and 9B are cross-sectional views of the electronic device according to various embodiments. FIG. 9A is a cross-sectional view taken along line A-A' of FIGS. 5A and 5B. FIG. 9B is a cross-sectional view taken along line B-B' of FIGS. 5A and 5B.

In an embodiment, the first area 211 of the first flexible substrate 210 may be disposed on the plate structure 142, and the second area 212 of the first flexible substrate 210 may extend in a direction (e.g., the −Z-axis direction) toward the back plate 180. The second area 212 may extend into a space between the internal structure 160 and the battery frame 148. The first stiffener 213 on the second area 212 may be attached to the battery frame 148. The first connector 214 on the second area 212 may be coupled to the second connector 224 in a direction (e.g., the −Y-axis direction) substantially perpendicular to the Z-axis.

In an embodiment, the third area 221 of the second flexible substrate 220 may be located in a space between the back plate 180 and the battery frame 148, and the fourth area 222 of the second flexible substrate 220 may extend in a direction (e.g., the +Z-axis direction) toward the display module 130. The fourth area 222 may extend into the space between the internal structure 160 and the battery frame 148. The second connector 224 on the fourth area 222 may be coupled to the first connector 214 in a direction (e.g., the Y-axis direction) substantially perpendicular to the Z-axis. The second stiffener 223 on the fourth area 222 may be coupled to the first bracket 240. For example, the second stiffener 223 may be attached to the first plate 241 of the first bracket 240 through an adhesive member 261.

Referring to FIG. 9A, the hook portions 242 of the first bracket 240 may be located on the second plate 251 of the second bracket 250. For example, the hook portions 242 may be formed to surround an edge of the second plate 251 of the second bracket 250. For example, the hook portions 242 may be configured to support the second bracket 250 in the −Z-axis direction.

Referring to FIGS. 9A and 9B, the first bending portion 243 and the second bending portion 244 of the first bracket 240 may surround at least part of the second stiffener 223 such that the second stiffener 223 of the second flexible substrate 220 is not separated from the first bracket 240. Accordingly, separation of the second flexible substrate 220 from the first flexible substrate 210 may be prevented and/or reduced. For example, the first bending portion 243 and the second bending portion 244 may be formed to face each other in the Z-axis direction, and the second stiffener 223 may be disposed between the first bending portion 243 and the second bending portion 244. In various embodiments, one of the first bending portion 243 or the second bending portion 244 may be omitted.

In an embodiment, referring to FIG. 9B, the first bracket 240 may be configured to prevent and/or reduce separation of the second flexible substrate 220. For example, the first plate 241 of the first bracket 240 and the second flexible substrate 220 may be coupled through the adhesive member 261. The adhesive force of the adhesive member 261 may be weakened as predetermined time elapses. Furthermore, for example, a repulsive force may act on the second flexible substrate 220, part of which is curved, to return the second flexible substrate 220 to a flat state. The coupling of the second flexible substrate 220 and the first bracket 240 may be released due to the weakened adhesive force of the adhesive member 261 and the repulsive force. For example, the second flexible substrate 220 may be separated from the first bracket 240 as the adhesive member 261 is stripped from the first bracket 240. The electronic device 100 according to various embodiments may include the first bracket 240 including the first bending portion 243 and the second bending portion 244 that surround at least part of the second stiffener 223 of the second flexible substrate 220 and may prevent and/or reduce the possibility of the second flexible substrate 220 from being separated from the first bracket 240.

In an embodiment, referring to FIG. 9A, the first bracket 240 may be configured so as not to be separated from the second bracket 250. For example, the first bracket 240 and the second flexible substrate 220 may be coupled through the adhesive member 261, and the repulsive force of the bent second flexible substrate 220 may act on the first bracket 240. The repulsive force may separate the first bracket 240 from the second bracket 250 fixed to the plate structure 142. To prevent and/or reduce the separation of the first bracket 240, the first bracket 240 may include the hook portions 242 surrounding at least part of an edge of the second bracket 250. For example, the hook portions 242 may be formed in a direction to resist the separation of the first bracket 240. For example, the first bracket 240 may be moved in the −Z-axis direction by the repulsive force of the second flexible substrate 220, and to prevent and/or reduce the movement of the first bracket 240, the hook portions 242 may be formed to surround at least part of the edge of the second bracket 250 that faces the +Z-axis direction. Accordingly, when the repulsive force acts on the first bracket 240, the hook portions 242 may prevent and/or reduce the first bracket 240 from being separated from the second bracket 250.

The shapes and coupling structures of the first bracket 240 and the second bracket 250 of the electronic device 100 according to various embodiments are not limited to those illustrated in FIGS. 9A and 9B.

Figure 10A:
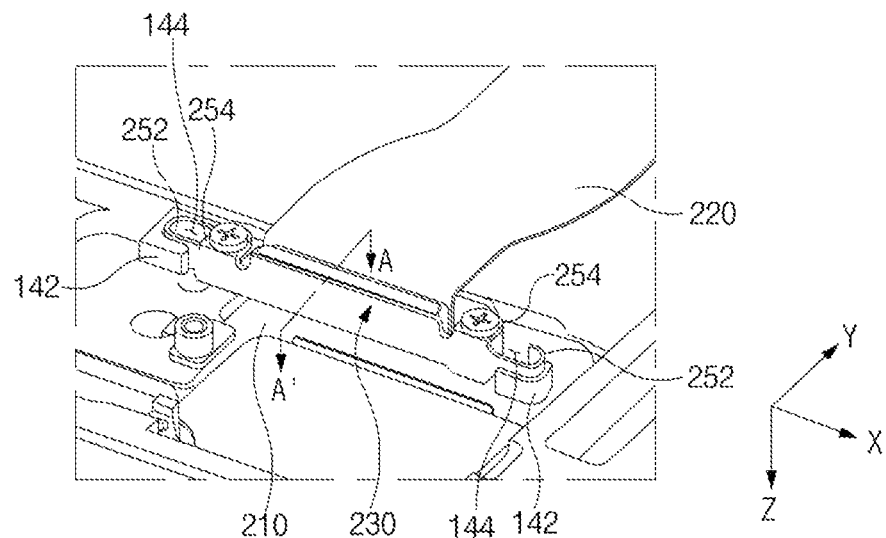
FIGS. 10A and 10B are views illustrating an electronic device according to various embodiments.
Figure 10B:
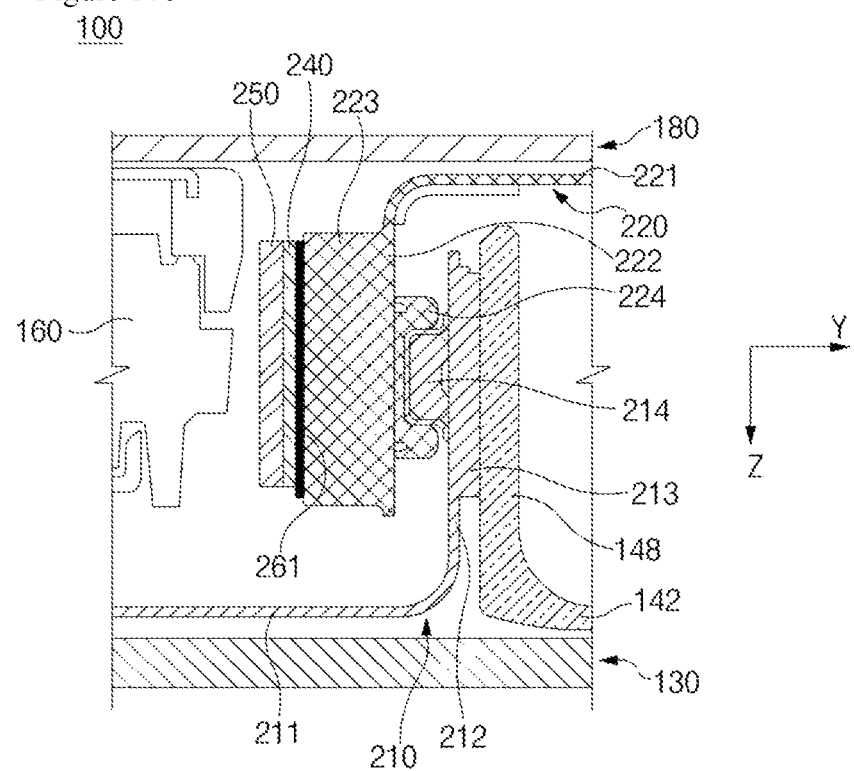

FIG. 10A is a perspective view illustrating an electronic device according to various embodiments. FIG. 10B is a cross-sectional view of the electronic device according to the various embodiments. FIG. 10B is a sectional view taken along line A-A' of FIG. 10A. In describing FIGS. 10A and 10B, repetitive descriptions identical or similar to ones given with regard to the embodiment illustrated in FIGS. 9A and 9B may not be repeated.

Repulsive forces of flexible substrates 210 and 220 may be related to the thicknesses of the substrates and the curvatures of bending portions. For example, when the flexible substrates 210 and 220 have small thicknesses, the repulsive forces of the flexible substrates 210 and 220 may be relatively small. For example, as the lengths of the bending portions are increased, the curvatures of the bending portions may be decreased, and the repulsive forces of the flexible substrates 210 and 220 may be decreased. As described above with reference to FIG. 4, when the first flexible substrate 210 and the second flexible substrate 220 have large repulsive forces, partial areas (e.g., the overlapping areas A of FIG. 4) of the first flexible substrate 210 and the second flexible substrate 220 may overlap each other to provide a length sufficient to bend the first flexible substrate 210 and the second flexible substrate 220.

According to the embodiment illustrated in FIGS. 10A and 10B, the electronic device 100 may include the second flexible substrate 220 having a relatively small repulsive force. For example, the second flexible substrate 220 illustrated in FIGS. 10A and 10B may have a smaller repulsive force than the second flexible substrate 220 illustrated in FIGS. 9A and 9B. For example, an adhesive member 261 may provide an adhesive force sufficient to attach a first bracket 240 and the second flexible substrate 220. In this case, a first bending portion 243 and a second bending portion 244 of the first bracket 240 may be omitted.

In various embodiments, hook portions 242 and/or the bending portions 243 and 244 of the first bracket 240 may be omitted depending on properties (e.g., the thickness and the curvature) of the second flexible substrate 220.

Figure 11:
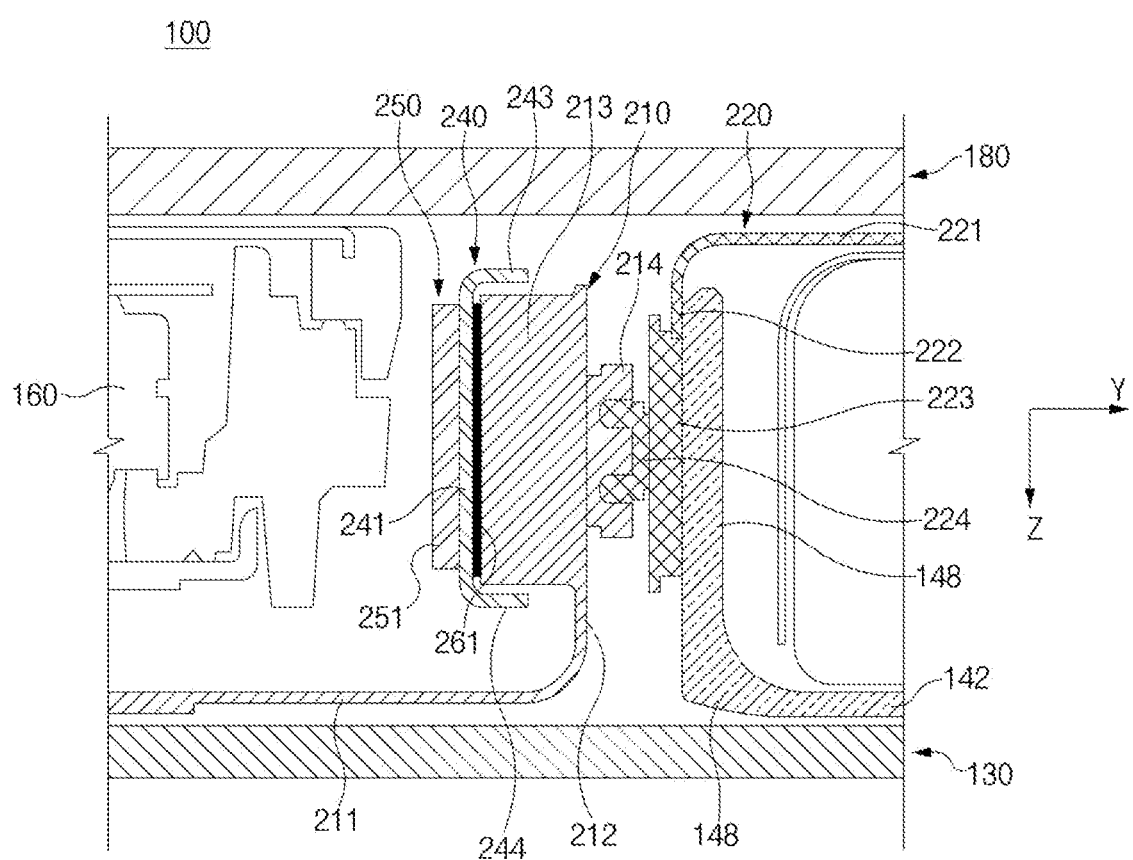
FIG. 11 is a cross-sectional view of an electronic device according to various embodiments.
Figure 12:
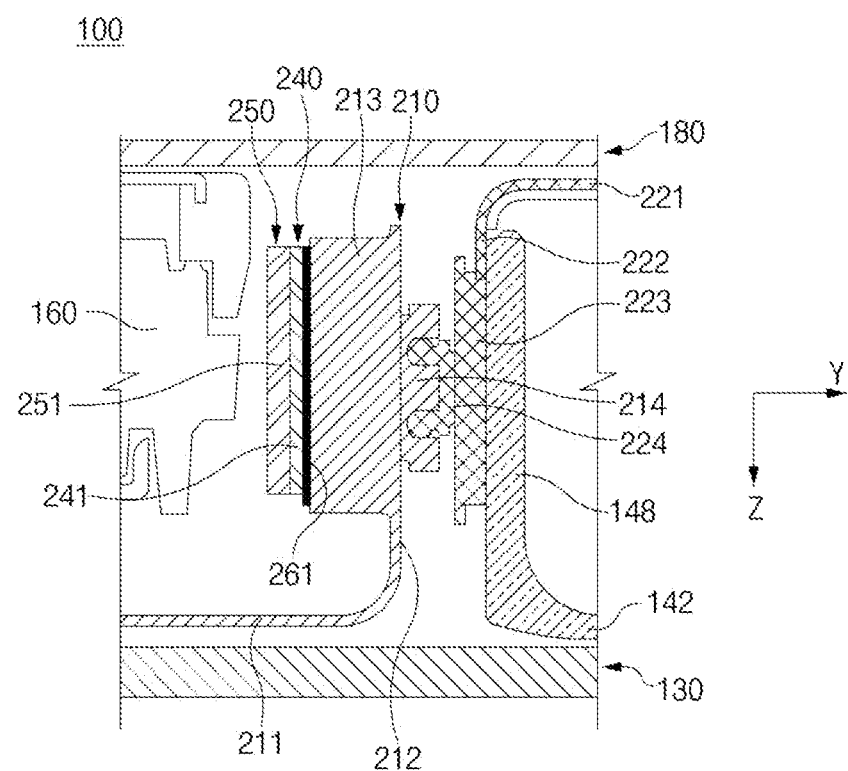
FIG. 12 is a cross-sectional view of the electronic device according to the various embodiments.

FIG. 11 is a cross-sectional view of an electronic device according to various embodiments. FIG. 12 is a cross-sectional view of the electronic device according to various embodiments. Unlike in the example illustrated in FIG. 4, a first flexible substrate and a second flexible substrate may not overlap each other in the embodiment illustrated in FIGS. 11 and 12.

Referring again to the embodiment illustrated in FIG. 4, the first flexible substrate 210 and the second flexible substrate 220 may be configured such that, when viewed in the Z-axis direction (e.g., when the back plate 180 is viewed from above), partial areas (e.g., the overlapping areas A of FIG. 4) overlap each other in the limited space between the battery frame 148 and the internal structure 160 to ensure a sufficient length for bending of the first flexible substrate 210 and the second flexible substrate 220. However, without being limited to that illustrated in FIG. 4, the electronic device 100 according to various embodiments may include various structures depending on properties of the flexible substrates 210 and 220 and/or the size of a space in which the flexible substrates 210 and 220 are able to be bent.

For example, referring to FIGS. 11 and 12, a first flexible substrate 210 and a second flexible substrate 220 may be configured so as not to overlap each other in the Z-axis direction. For example, when the first flexible substrate 210 and the second flexible substrate 220 have relatively small thicknesses or a space between a battery frame 148 and an internal structure 160 is relatively wide, the first flexible substrate 210 and the second flexible substrate 220 may be disposed without overlapping areas.

Referring to FIGS. 11 and 12, a first area 211 of the first flexible substrate 210 may be disposed on a plate structure 142, and a second area 212 of the first flexible substrate 210 may extend in a direction (e.g., the −Z-axis direction) toward a back plate 180. The second area 212 may extend into the space between the internal structure 160 and the battery frame 148. A first connector 214 on the second area 212 may be coupled to a second connector 224 in a direction substantially perpendicular to the Z-axis. The second area 212 may be spaced apart from the battery frame 148 by a predetermined gap and may face the battery frame 148. In an embodiment, a first stiffener 213 of the first flexible substrate 210 may be attached to a first bracket 240. The first stiffener 213 may be attached to the first bracket 240 through an adhesive member 261 (e.g., a double-sided adhesive tape).

Referring to FIGS. 11 and 12, a third area 221 of the second flexible substrate 220 may be located in a space between the back plate 180 and the battery frame 148, and a fourth area 222 of the second flexible substrate 220 may extend in a direction (e.g., the +Z-axis direction) toward a display module 130. The fourth area 222 may extend into the space between the internal structure 160 and the battery frame 148. The second connector 224 on the fourth area 222 may be coupled to the first connector 214 in a direction substantially perpendicular to the Z-axis. In an embodiment, a second stiffener 223 on the fourth area 222 may be attached to the battery frame 148.

In various embodiments, separation of the first flexible substrate 210 from the first bracket 240 may be prevented and/or reduced by a first bending portion 243 and/or a second bending portion 244 of the first bracket 240. For example, at least part of the first stiffener 213 of the first flexible substrate 210 may be located between the first bending portion 243 and the second bending portion 244.

In various embodiments (not illustrated), the first bracket 240 may include hook portions (e.g., the hook portions 242 of FIG. 6) that surround an edge of a second plate 251 of a second bracket 250.

In various embodiments (not illustrated), the first bracket 240 may not include the first bending portion 243 and may include only the second bending portion 244. For example, the first stiffener 213 of the first flexible substrate 210 and the first bracket 240 may be coupled through the adhesive member 261. For example, a repulsive force of the first flexible substrate 210 may mainly act in the +Z-axis direction (e.g., the lower direction in the drawings). To prevent and/or reduce the first flexible substrate 210 from being separated from the first bracket 240, the first bracket 240 may include the second bending portion 244. The second bending portion 244 may be formed at a first edge (e.g., the first edge P1 of FIG. 6) of a first plate 241 of the first bracket 240 and may support the first stiffener 213 of the first flexible substrate 210 in the −Z-axis direction (e.g., the upper direction in the drawings).

The shapes and coupling structures of the first bracket 240 and the second bracket 250 of the electronic device 100 according to various embodiments are not limited to those illustrated in the drawings.

For example, referring to FIG. 11, the first bending portion 243 and the second bending portion 244 of the first bracket 240 may be omitted. For example, a case in which the first flexible substrate 210 has a relatively small thickness or a sufficient space for bending of the first flexible substrate 210 is ensured may be considered. In this case, the repulsive force of the first flexible substrate 210 may be relatively small. That is, the adhesive member 261 may provide an adhesive force sufficient to firmly couple the first flexible substrate 210 and the first bracket 240. The adhesive force may correspond to the repulsive force of the first flexible substrate 210. Referring to FIG. 11, at least one of the first bending portion 243 and/or the second bending portion 244 may be omitted from the first bracket 240. In various embodiments (not illustrated), the hook portions (e.g., the hook portions 242 of FIG. 6) may be formed on the first bracket 240.

Figure 13A:
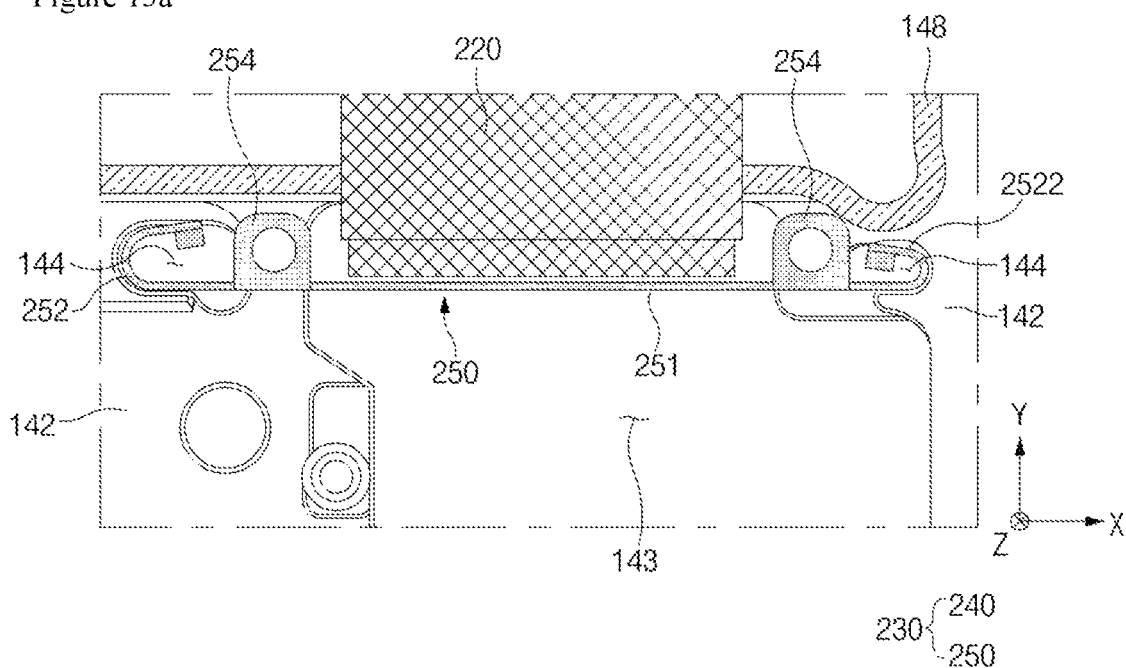
FIGS. 13A and 13B are cross-sectional views illustrating a first bracket and a second bracket of the electronic device according to various embodiments.
Figure 13B:
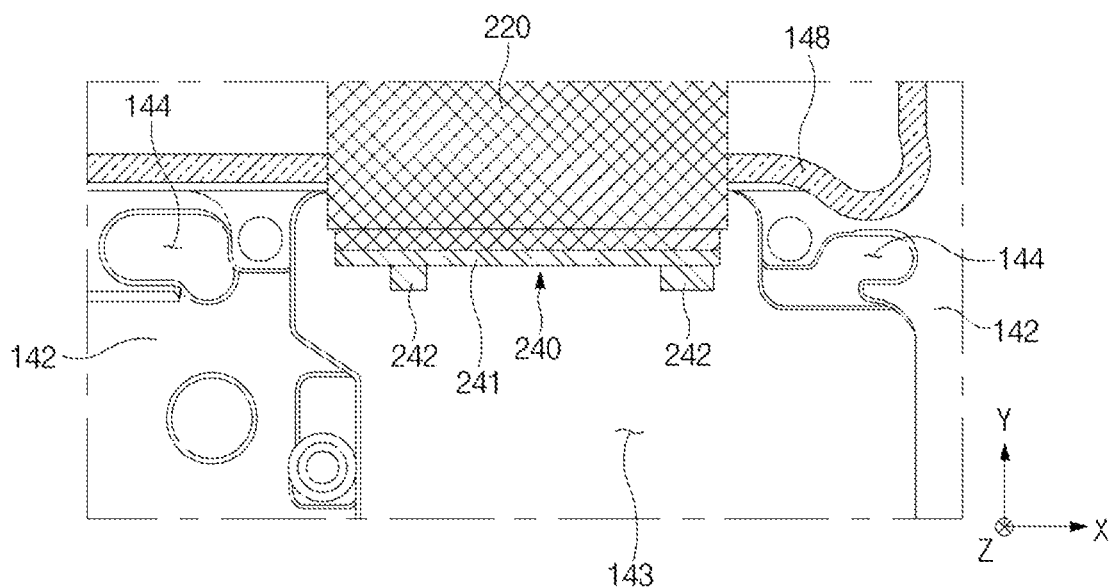

FIGS. 13A and 13B are cross-sectional views illustrating the first bracket and the second bracket of the electronic device according to various embodiments.

Referring to FIG. 13B, the first bracket 240, when viewed in the Z-axis direction, may be located in the opening area 143 formed in the plate structure 142. For example, to pass through the opening area 143, the first bracket 240 may be formed to be smaller than the opening area 143. The first bracket 240 may be coupled to the second bracket 250 through the hook portions 242.

Referring to FIG. 13A, the second bracket 250, when viewed in the Z-axis direction, may extend across the opening area 143 formed in the plate structure 142. For example, the first fixing portion 2521 and the second fixing portion 2522 may be located on one side and an opposite side of the opening area 143. At least part of the second plate 251 of the second bracket 250 may be located in the opening area 143 when viewed in the Z-axis direction. For example, the second bracket 250, when viewed in the X-axis direction, may be formed to be larger than the opening area 143.

The electronic device 100 according to various embodiments may include the bracket structure 230 for supporting one of the two flexible substrates 210 and 220, and the bracket structure 230 may include the two brackets 240 and 250. Referring to an assembly process of FIG. 14 together, first, the first connector 214 of the first flexible substrate 210 and the second connector 224 of the second flexible substrate 220 may be fastened with each other. The first bracket 240 may be coupled to the first stiffener 213 of the first flexible substrate 210 or the second stiffener 223 of the second flexible substrate 220. Then, the first flexible substrate 210 and the second flexible substrate 220, together with the first bracket 240, may pass through the opening area 143 and may be coupled to the plate structure 142. After that, the second bracket 250 may be coupled to the first bracket 240.

The first bracket 240 directly coupled to the first stiffener 213 or the second stiffener 223 may be formed to be small such that the first bracket 240 is able to pass through the opening area 143, and the second bracket 250 may be formed to be larger than the opening area 143 such that the second bracket 250 includes the fixing portions 2521 and 2522 that are fixed to the plate structure 142.

However, the bracket structure 230 of the electronic device 100 according to various embodiments is not limited to that illustrated in the drawings. For example, the first bracket 240 and the second bracket 250 may be integrally formed with each other (e.g., FIGS. 15 and 17). For example, the opening area 143 may be formed large enough to allow an integrated bracket coupled with the first connector 214 and the second connector 224 to pass through the opening area 143 in an assembly process. For example, as in various embodiments illustrated in FIGS. 15 to 19B, the electronic device 100 may include an integrated bracket (e.g., brackets 330 and 340 of FIGS. 15 to 19B) having the first bracket 240 and the second bracket 250 integrally formed with each other.

FIGS. 14A, 14B, 14C, 14D, 14E and 14F are diagrams illustrating an example process of assembling the first flexible substrate, the second flexible substrate, the bracket structure, and the plate structure of the electronic device according to various embodiments.

Figure 14A:
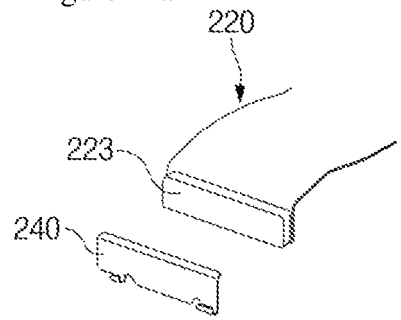
FIGS. 14A, 14B, 14C, 14D, 14E and 14F are diagrams illustrating an example method of assembling the first flexible substrate, the second flexible substrate, the bracket structure, and a plate structure of the electronic device according to various embodiments.

Referring to FIG. 14A, the first bracket 240 may be coupled to the second flexible substrate 220. For example, the first bracket 240 may be attached to the second stiffener 223 of the second flexible substrate 220. The second flexible substrate 220 may be in a state of not being connected to the first circuit board 151.

Figure 14B:
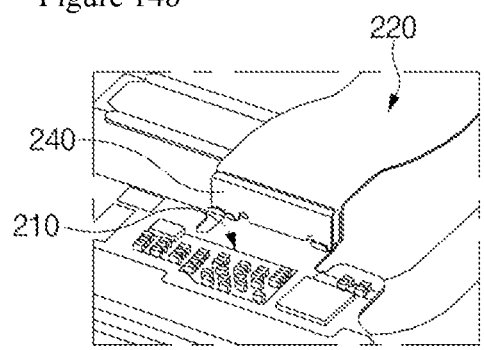

Referring to FIG. 14B, a display module (e.g., the display module 130 of FIG. 4) may be seated on the plate structure 142. The first flexible substrate 210 extending from the display module 130 may pass through the opening area 143 of the plate structure 142 and may be coupled with the second flexible substrate 220. The first connector 214 of the first flexible substrate 210 and the second connector 224 of the second flexible substrate 220 may be coupled. As described above, to pass through the opening area 143, the first bracket 240 may be formed to be smaller than the opening area 143.

Figure 14C:
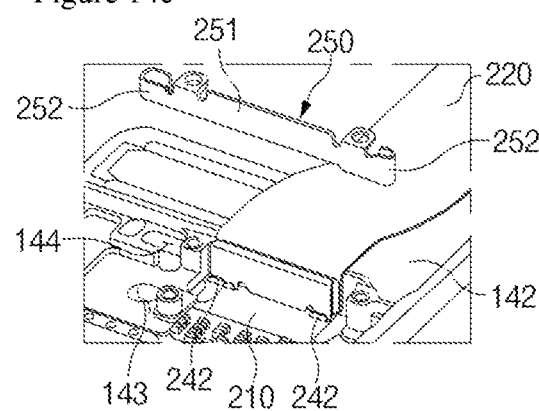

Referring to FIG. 14C, the second bracket 250 may be coupled such that the fixing portions 252 are accommodated in the recesses 144 of the plate structure 142. The second bracket 250 may be formed to be larger than the opening area 143 to cross over the opening area 143. In consideration of an assembly process of the electronic device 100 having a limited space, the electronic device 100 according to various embodiments may include the first bracket 240 capable of passing through the opening area 143 and the second bracket 250 fixed to the housing 140.

Figure 14D:
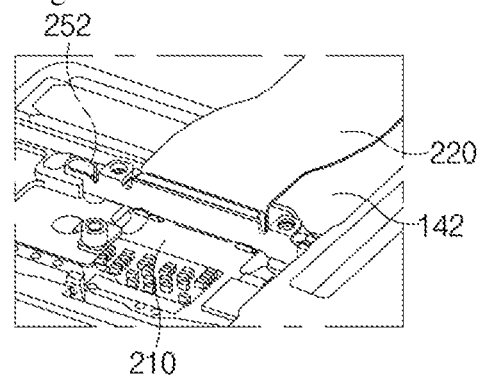

Referring to FIG. 14D, the second bracket 250 may be coupled to the first bracket 240 through the hook portions 242 and may be fixed to the plate structure 142 through the fixing portions 252. At this time, the second flexible substrate 220 may be connected to the first circuit board 151.

Figure 14E:
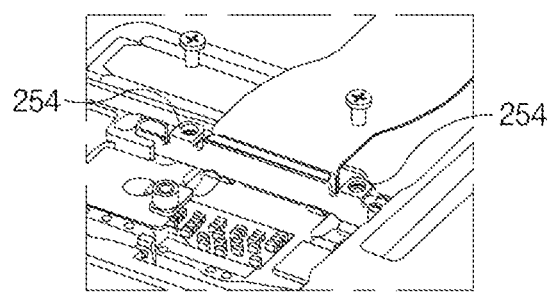

Referring to FIG. 14E, screws may be fastened to the screw coupling portions 254 of the second bracket 250, and the second bracket 250 may be additionally fixed to the plate structure 142.

Figure 14F:
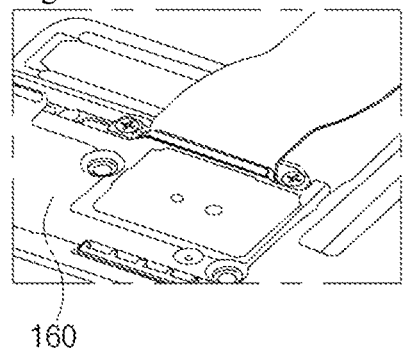

Referring to FIG. 14F, the internal structure 160 (e.g., the support members 161 and 162 of FIG. 2B) may be disposed to cover the first flexible substrate 210.

However, FIGS. 14A, 14B, 14C, 14D, 14E and 14F (which may be referred to hereinafter as FIGS. 14A-14F) illustrated one example, and a sequence of assembling the first flexible substrate 210, the second flexible substrate 220, and the brackets 240 and 250 of the electronic device 100 according to various embodiments is not limited to that illustrated in FIGS. 14A-14F. For example, when the opening area 143 is sufficiently large, assembly may be performed in a different sequence using an integrated bracket.

Figure 15:
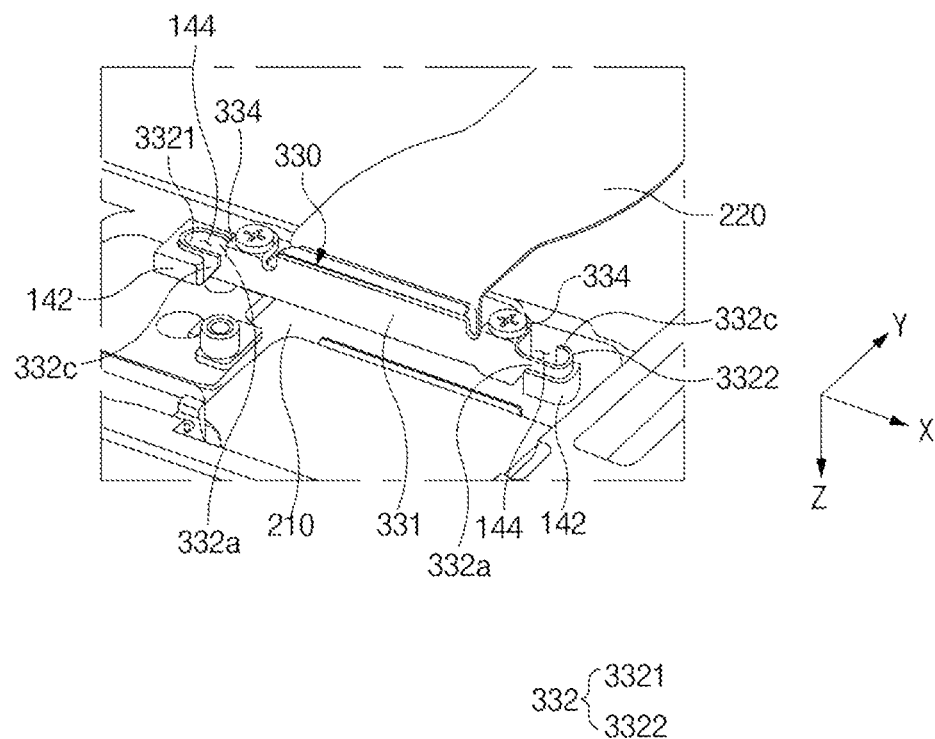
FIG. 15 is a perspective view illustrating an example of the brackets of the electronic device according to various embodiments.
Figure 16A:
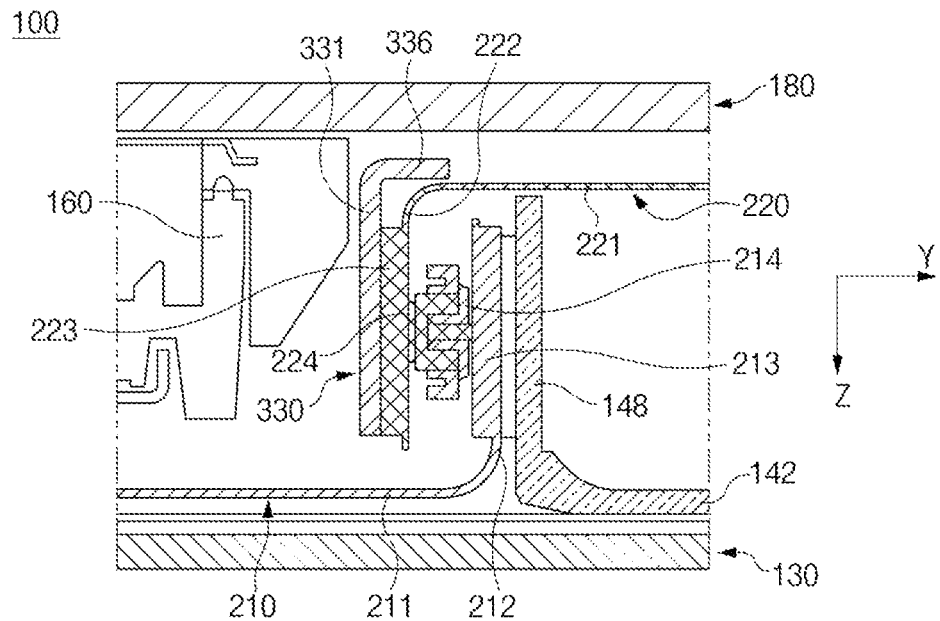
FIGS. 16A and 16B are cross-sectional views of an electronic device including the bracket illustrated in FIG. 15 according to various embodiments.
Figure 16B:
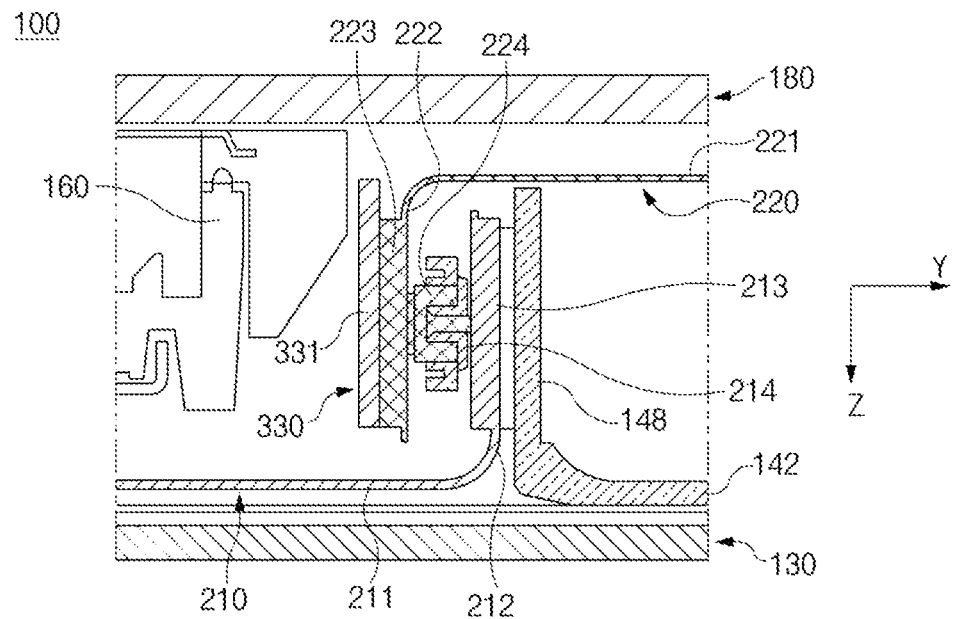
Figure 17:
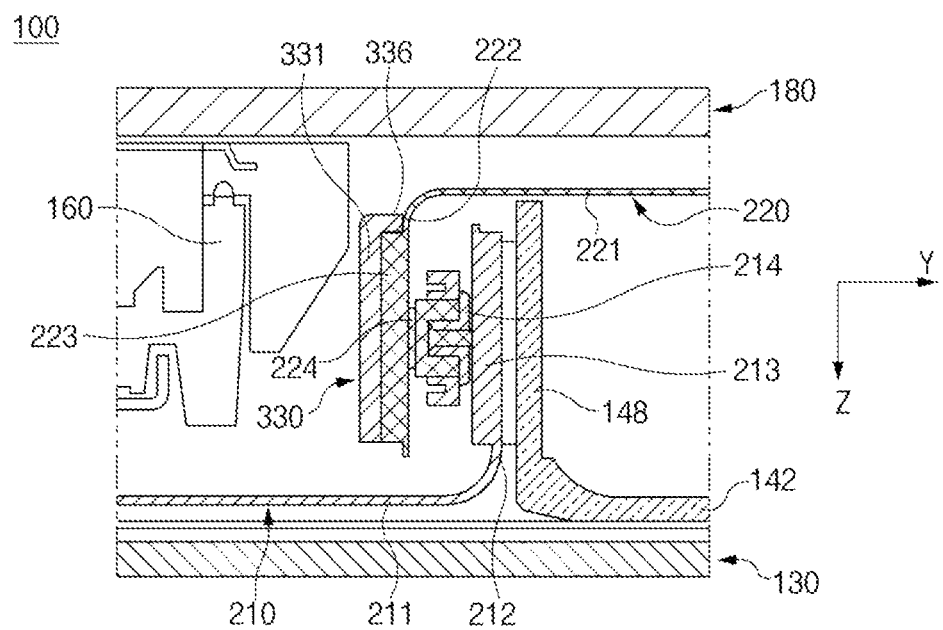
FIG. 17 is a cross-sectional view illustrating an example of the electronic device including the bracket illustrated in FIG. 15 according to various embodiments.

FIG. 15 is a perspective view illustrating an example of the brackets of the electronic device according to various embodiments. FIGS. 16A and 16B are cross-sectional views of an electronic device including the bracket illustrated in FIG. 15 according to various embodiments. FIG. 17 is a cross-sectional view illustrating an example of the electronic device including the bracket illustrated in FIG. 15 according to various embodiments.

Referring to FIG. 15, the electronic device 100 may include a bracket 330 coupled to a second flexible substrate 220. The bracket 330 illustrated in FIGS. 15, 16A, and 16B may be an integrated bracket in which the first bracket 240 and the second bracket 250 illustrated in FIGS. 4 to 14 are integrally formed with each other. The bracket 330 may include a plate 331, fixing portions 332 extending from the plate 331 in opposite directions, and screw coupling portions 334 screw-coupled to a plate structure 142. The fixing portions 332 and the screw coupling portions 334 are identical or similar to those described above with reference to FIGS. 4 to 14, and therefore redundant descriptions may not be repeated.

In various embodiments, fixing portions 3321 and 3322 of the bracket 330 may be bent in the same direction as illustrated in FIG. 6, or may be bent in opposite directions as illustrated in FIG. 15.

In various embodiments, the first fixing portion 3321 of the bracket 330 may be bent in a different direction from the second fixing portion 3322 of the bracket 330. For example, the first fixing portion 3321 may be bent such that a third area 332c is located in the −Y-axis direction with respect to a first area 332a. For example, the second fixing portion 3322 may be bent such that a third area 332c is located in the +Y-axis direction with respect to a first area 332a.

In an embodiment, a first flexible substrate 210 may be bent such that a first area 211 is located in an opening area (e.g., the opening area 143 of FIG. 2A) of the plate structure 142 and a second area 212 is coupled to a battery frame 148. The second area 212 of the first flexible substrate 210 may include a first stiffener 213 for increasing the strength of the first flexible substrate 210 and a first connector 214 formed on a facing surface of the first stiffener 213. The first connector 214 may be physically coupled with a second connector 224. The first connector 214 and the second connector 224 may be coupled in a direction perpendicular to the Z-axis. The first stiffener 213 may be attached to the battery frame 148 through an adhesive member.

In an embodiment, the second flexible substrate 220 may extend such that a third area 221 is located in a space between the battery frame 148 and a back plate 180 and a fourth area 222 is spaced apart from the battery frame 148 by a predetermined gap. The fourth area 222 of the second flexible substrate 220 may include a second stiffener 223 for increasing the strength of the second flexible substrate 220 and the second connector 224 formed on a facing surface of the second stiffener 223. The second connector 224 may be physically coupled with the first connector 214. The second connector 224 and the first connector 214 may be coupled in the direction perpendicular to the Z-axis. The second stiffener 223 may be coupled to the bracket 330. For example, the second stiffener 223 may be attached to the plate 331 of the bracket 330 through an adhesive member.

In an embodiment illustrated in FIG. 16A, the bracket 330 may include a bending portion 336 extending from an edge of the plate 331. The bending portion 336 may be bent toward the battery frame 148 to surround part of the second flexible substrate 220. In an embodiment, the bending portion 336 may surround part of the second flexible substrate 220 to prevent and/or reduce the second flexible substrate 220 from being separated from the bracket 330 by a repulsive force of the second flexible substrate 220. For example, the bending portion 336 may be referred to as the bending portion 243 or 244 of the first bracket 240 illustrated in FIGS. 9A and 9B.

The bracket 330 of the electronic device 100 according to various embodiments is not necessarily limited to including the bending portion 336. For example, in the case of the second flexible substrate 220 having a relatively small repulsive force, the bending portion 336 may be omitted. For example, the bending portion 336 may be omitted as in the embodiment illustrated in FIG. 16B. As illustrated in FIG. 9B, the bending portion 336 may extend so as to be located in the Z-axis direction and the −Z-axis direction with respect to the second stiffener 223 of the second flexible substrate 220.

Referring to FIG. 17, the bending portion 336 of the bracket 330 may extend from the plate 331 so as to make contact with the second stiffener 223. For example, the bending portion 336 may make contact with a side of the second stiffener 223 that faces the −Z-axis direction.

Referring to FIG. 17, the bending portion 336 may be formed so as not to cover a curved portion of the second flexible substrate 220. For example, when viewed in the +Z-axis direction, the curved portion of the second flexible substrate 220 may not be hidden by the bending portion 336. For example, when viewed in the +Z-axis direction, the curved portion of the second flexible substrate 220 may be formed to hide only at least part of the second stiffener 223.

Referring to FIG. 17, unlike the fourth area 222 coupled to the bracket 330, the curved portion of the second flexible substrate 220 may be formed to be flexible and may be movable. The movable curved portion may be damaged by collision with the bending portion 336. To prevent and/or reduce the damage to the curved portion, the bending portion 336 may surround only a rigid area (e.g., the second stiffener 223) fixed to the bracket 330.

Figure 18:
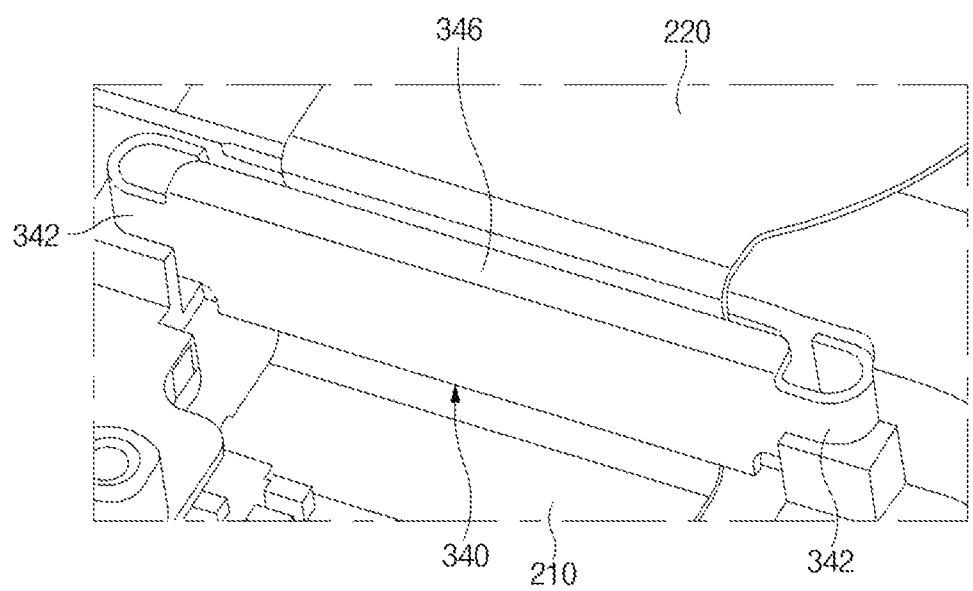
FIG. 18 is a perspective view illustrating an example of the brackets of the electronic device according to various embodiments.
Figure 19A:
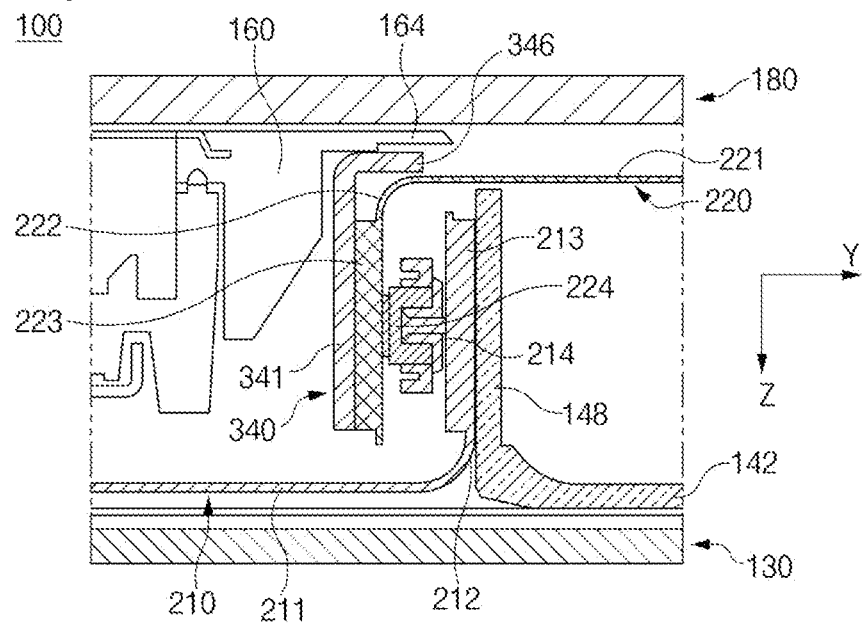
FIGS. 19A and 19B are cross-sectional views of an electronic device including the bracket illustrated in FIG. 18 according to various embodiments.
Figure 19B:
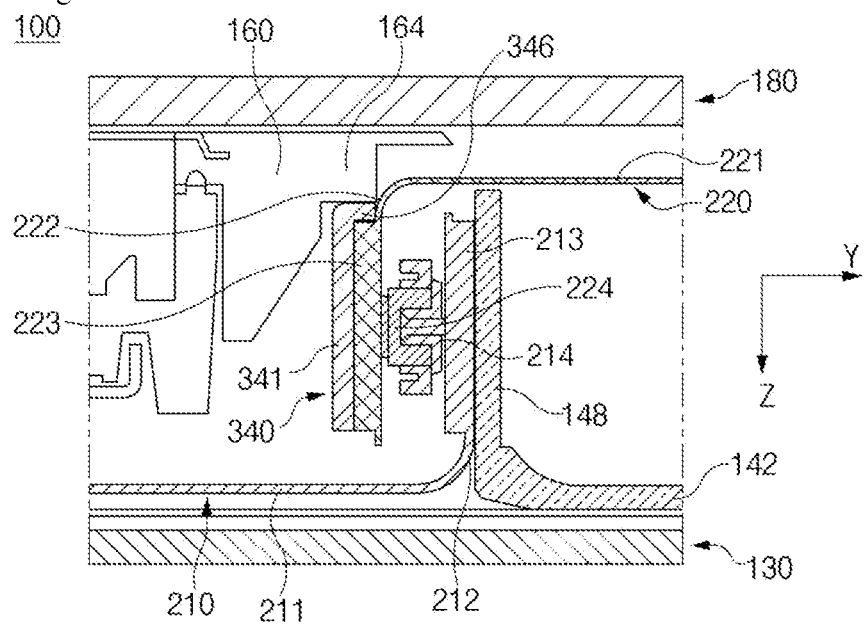
Figure 20:
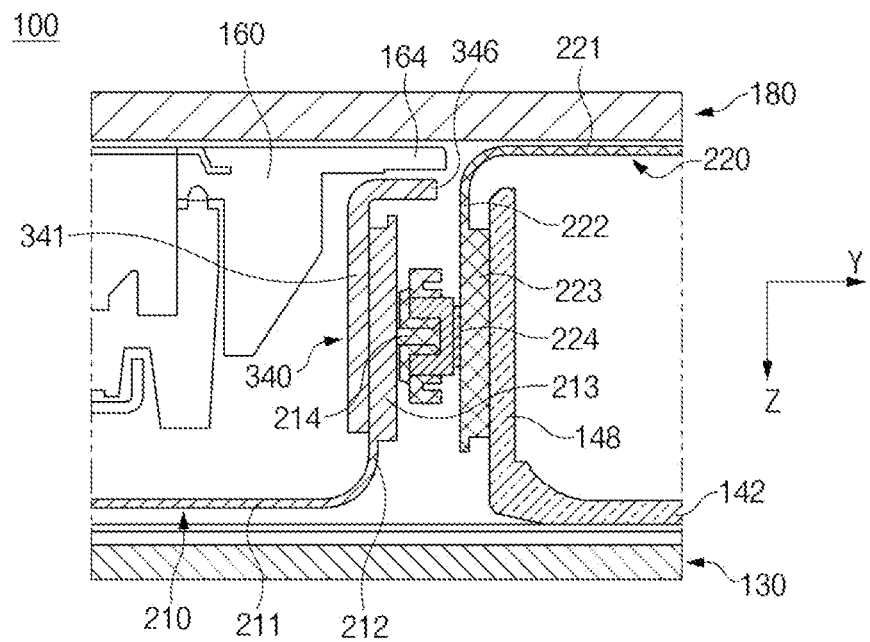
FIG. 20 is a cross-sectional view of an electronic device according to various embodiments.

FIG. 18 is a perspective view illustrating an example of the brackets of the electronic device according to various embodiments. FIGS. 19A and 19B are cross-sectional views of an electronic device including the bracket illustrated in FIG. 18 according to various embodiments. FIG. 20 is a cross-sectional view of an electronic device according to various embodiments.

Referring to FIGS. 18, 19A, and 19B, the electronic device 100 may include a bracket 340 coupled to a second flexible substrate 220. The bracket 340 illustrated in FIGS.

18, 19A, and 19B may be a bracket not including the screw coupling portions 334 of the bracket 330 illustrated in FIG. 15. In an embodiment, the bracket 340 may include a plate 341, fixing portions 342 extending from the plate 341 in opposite directions, and a bending portion 346 extending from the plate 341. The fixing portions 342 are identical to those described above with reference to FIGS. 4 to 13B, and therefore descriptions thereabout will be omitted. As described above with reference to FIG. 15, the bending portion 346 may prevent and/or reduce a first flexible substrate 210 and the second flexible substrate 220 from being separated from the bracket 340 by repulsive forces of the flexible substrates 210 and 220.

The bracket 340 illustrated in FIGS. 18, 19A, and 19B may be fixed in the Z-axis direction by an internal structure 160 of the electronic device 100. For example, the internal structure 160 of the electronic device 100 may include an extending portion 164 that extends into a space between the bending portion 346 of the bracket 340 and a back plate 180. At least part of the extending portion 164 may make contact with the bending portion 346. The extending portion 164 may be configured to press the bracket 340 toward a display module 130. Accordingly, the bracket 340 may be fixed to a plate structure 142 of the electronic device 100 in the Z-axis direction without a separate screw.

In an embodiment, a fourth area 222 of the second flexible substrate 220 may be coupled to the plate 341 of the bracket 340. For example, a second stiffener 223 included in the fourth area 222 may be attached to the plate 341 through an adhesive member.

Although not illustrated, according to various embodiments, the bracket 340 may be fixed in the Z-axis direction through the fixing portions 342 that are press-fit into recesses 144. For example, as illustrated in FIGS. 13A and 13B, the fixing portions 342 of the bracket 340 may be configured to press sidewalls of the recesses 144 and may be additionally fixed in the Z-axis direction.

Referring to FIGS. 19A and 19B, when viewed in the Z-axis direction, the first flexible substrate 210 and the second flexible substrate 220 may be configured such that partial areas thereof overlap each other. For example, the bracket 340 may be coupled to the fourth area 222 of the second flexible substrate 220. However, the electronic device 100 is not necessarily limited to the illustrated structure. For example, the electronic device 100 may include a structure in which the first flexible substrate 210 and the second flexible substrate 220 do not overlap each other as illustrated in FIG. 20.

Referring to FIG. 19B, the bending portion 346 of the bracket 340 may extend from the plate 341 so as to make contact with the second stiffener 223. For example, the bending portion 346 may make contact with a side of the second stiffener 223 that faces the −Z-axis direction.

Referring to FIG. 19B, the bending portion 346 may be formed so as not to cover a curved portion of the second flexible substrate 220. For example, when viewed in the +Z-axis direction, the curved portion of the second flexible substrate 220 may not be hidden by the bending portion 346. For example, when viewed in the +Z-axis direction, the curved portion of the second flexible substrate 220 may be formed to hide only at least part of the second stiffener 223.

Referring to FIG. 19B, unlike the fourth area 222 coupled to the bracket 340, the curved portion of the second flexible substrate 220 may be formed to be flexible and may be movable. The movable curved portion may be damaged by collision with the bending portion 346. To prevent and/or reduce the damage to the curved portion, the bending portion 346 may surround only a rigid area (e.g., the second stiffener 223) fixed to the bracket 340.

Referring to FIG. 20, the bracket 340 may be coupled to a second area 212 of the first flexible substrate 210. For example, the plate 341 of the bracket 340 may be attached to a first stiffener 213 included in the second area 212. The structure illustrated in FIG. 20 may be applied to a flexible substrate having a relatively small repulsive force. In various embodiments, when a sufficient space in which the first flexible substrate 210 and the second flexible substrate 220 are able to be bent is formed, as illustrated in FIG. 20, the fourth area 222 of the second flexible substrate 220 may be attached to a battery frame 148, and the second area 212 of the first flexible substrate 210 may be attached to the bracket 340.

Figure 21:
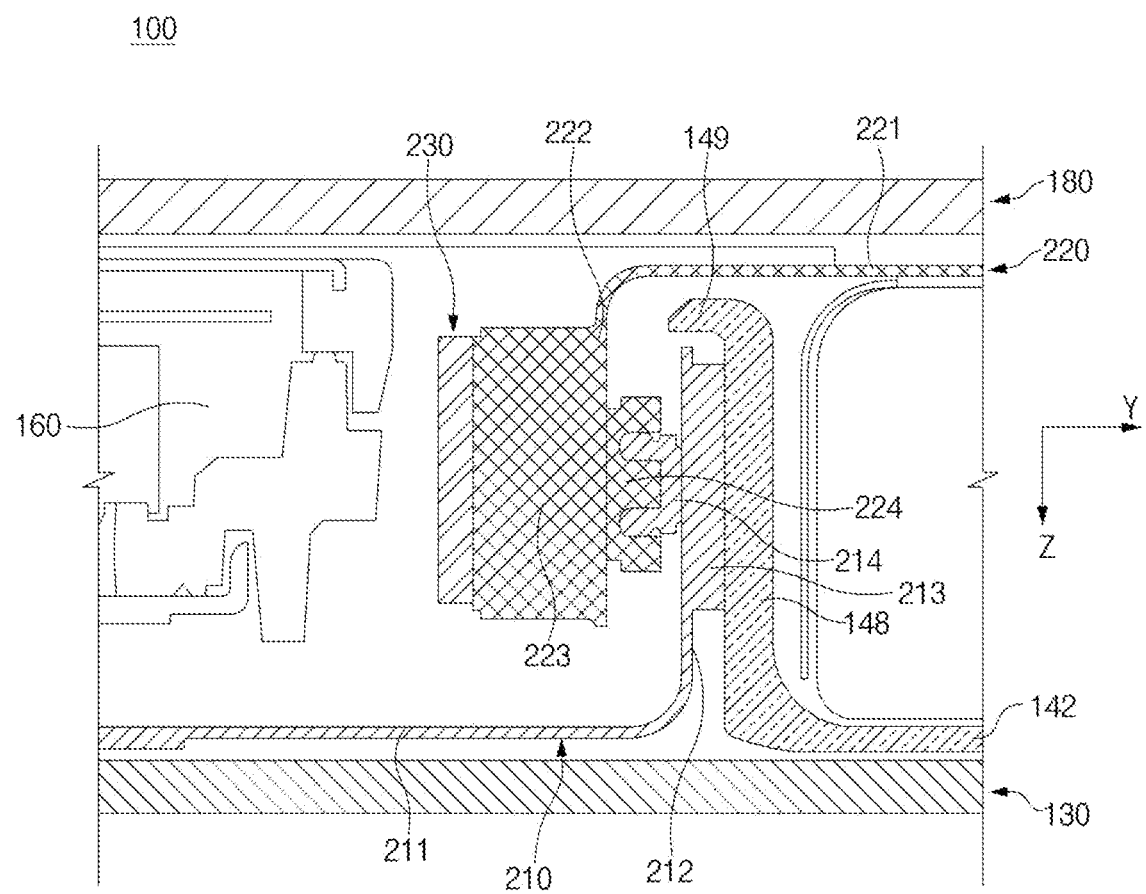
FIG. 21 is a cross-sectional view of an electronic device according to various embodiments.

FIG. 21 is a cross-sectional view of an electronic device according to various embodiments.

A bracket 230 illustrated in FIG. 21 may include at least one of the bracket structure (e.g., the first bracket 240 and the second bracket 250) illustrated in FIGS. 4 to 13B or the bracket 330 or 340 (e.g., an integrated bracket) illustrated in FIGS. 14 to 19B.

In an embodiment, a first flexible substrate 210 may be configured such that a first area 211 is disposed on a plate structure 142 and a second area 212 extends in a direction (e.g., the −Z-axis direction) toward a back plate 180. The second area 212 may extend into a space between an internal structure 160 and a battery frame 148. A first stiffener 213 on the second area 212 may be attached to the battery frame 148. A first connector 214 on the second area 212 may be coupled to a second connector 224 in a direction substantially perpendicular to the Z-axis.

In an embodiment, a second flexible substrate 220 may be configured such that a third area 221 is located in a space between the back plate 180 and the battery frame 148 and a fourth area 222 extends in a direction (e.g., the +Z-axis direction) toward a display module 130. The fourth area 222 may extend into the space between the internal structure 160 and the battery frame 148. The second connector 224 on the fourth area 222 may be coupled to the first connector 214 in a direction substantially perpendicular to the Z-axis. A second stiffener 223 on the fourth area 222 may be coupled to the bracket 230. For example, the second stiffener 223 may be attached to the bracket 230 through an adhesive member.

Referring to FIG. 21, the battery frame 148 may include a protruding portion 149 protruding toward the bracket 230. For example, the protruding portion 149 may protrude from an edge of the battery frame 148 that faces the −Z-axis direction. For example, at least part of the protruding portion 149 may face the display module 130. For example, the second area 212 of the first flexible substrate 210 may be located between the protruding portion 149 and the display module 130. For example, the first connector 214 and/or the first stiffener 213 of the first flexible substrate 210 may be disposed between the protruding portion 149 and the display module 130.

Referring to FIG. 21, the second area 212 of the first flexible substrate 210 may be guided by the protruding portion 149 of the battery frame 148. For example, the protruding portion 149 may prevent and/or reduce a movement of the first flexible substrate 210 by an external impact or an external force such as a repulsive force of the second flexible substrate 220. For example, when an external force (e.g., a repulsive force or a drop impact) acts on the first flexible substrate 210 or the adhesive force of an adhesive member is not sufficient, the first stiffener 213 of the first flexible substrate 210 may be separated from the battery frame 148. At this time, the protruding portion 149 of the battery frame 148 may prevent and/or reduce the first connector 214 of the first flexible substrate 210 from being disengaged from the second connector 224.

Referring to FIG. 21, the protruding portion 149 is illustrated as being integrally formed with the battery frame 148, but is not necessarily limited thereto. For example, the protruding portion 149 may include a separate structure coupled to the battery frame 148 by various coupling methods. In this case, the protruding portion 149 may contain a material (e.g., polymer) different from the material of the battery frame 148. For example, the various coupling methods may include hook coupling, screw coupling, rivet coupling, bonding, and/or press-fit. For example, the protruding portion 149 may be formed by molding metal or plastic on the battery frame 148. For example, the molding may include injection molding, insert molding, compression molding, and/or extrusion molding.

In various embodiments, the protruding portion 149 may be formed on, or coupled to, the battery frame 148 through various assembly methods and molding methods used in technical fields, in addition to the aforementioned methods.

In various embodiments, the electronic device 100 may include a guide structure (e.g., including a guide) for guiding the position of the first flexible substrate 210 and/or the position of the second flexible substrate 220. For example, the guide structure may be configured to support the first stiffener 213 and/or the second stiffener 223 in the +Z/−Z-axis directions. For example, the guide structure may be a structure insert-molded into, or bonded to, another structure (e.g., the battery frame 148 or the internal structure 160) located inside the electronic device 100.

An electronic device according to various example embodiments of the disclosure may include: a housing including a plate, a frame surrounding the plate, and a back plate facing a second surface of the plate and coupled to the frame, the back plate including a planar area facing a first direction, a display module including a display disposed on a first surface of the plate a battery and a circuit board disposed on the second surface of the plate, a first flexible substrate extending from the display module, the first flexible substrate extending to the second surface of the plate through an opening area of the plate, and a second flexible substrate extending from the circuit board to the first flexible substrate across the battery. The first flexible substrate may include a first area, at least part of which is located in the opening area, a second area extending from the first area toward the back plate, and a first connector disposed on the second area. The second flexible substrate may include a third area, at least part of which is located between the battery and the back plate, a fourth area extending from the third area toward the second surface of the plate, and a second connector disposed on the fourth area. The first flexible substrate and the second flexible substrate may be configured such that the first connector and the second connector are coupled in a second direction different from the first direction.

In various example embodiments, the first connector may be hidden by the second flexible substrate when the second surface of the plate structure is viewed in the first direction.

In various example embodiments, the second direction may be substantially perpendicular to the first direction.

In various example embodiments, the electronic device 100 may further include a bracket spaced apart from a battery frame by a gap and fixed to the plate, and the battery frame may at least partially surround the battery. One of the second area or the fourth area may be disposed on the battery frame, and the other of the second area or the fourth area may be coupled to the bracket.

In various example embodiments, the first area may include a layer extending from at least a part of layers included in the display module.

In various example embodiments, the electronic device may further include a display driver integrated circuit (IC) disposed on the first area of the first flexible substrate, and the display driver IC may be configured to drive the display module.

In various example embodiments, the bracket may be fixed to one side and an opposite side of the opening area.

In various example embodiments, the first flexible substrate may include a first stiffener comprising a material having a specified stiffness located on the second area, the second flexible substrate may include a second stiffener comprising a material having a specified stiffness located on the fourth area, and the bracket may be coupled to the first stiffener or the second stiffener.

In various example embodiments, the plate may include a recess located around the opening area, and the bracket may include a fixing portion, at least part of which is accommodated in the recess.

In various example embodiments, the fixing portion may provide an elastic force to a sidewall of the recess.

In various example embodiments, the first flexible substrate may include a first stiffener comprising a material having a specified stiffness located on the second area, the second flexible substrate may include a second stiffener comprising a material having a specified stiffness located on the fourth area, and the bracket may include a bending portion bent to surround part of the first stiffener or part of the second stiffener.

In various example embodiments, the bracket may include a first bracket having size smaller than the opening area and coupled to the second area or the fourth area and a second bracket fixed to a portion around the opening area across the opening area.

In various example embodiments, the first bracket may include a hook fastened with the second bracket.

An electronic device according to various example embodiments of the disclosure may include: a plate including a first surface, a second surface facing away from the first surface, and an opening area formed through the first surface and the second surface, a display module including a display disposed on the first surface and including a planar area facing a first direction, a circuit board disposed on the second surface, a first flexible substrate extending from the display module to the second surface through the opening area and including a first connector, and a second flexible substrate extending from the circuit board and including a second connector, wherein the first connector and the second connector may be coupled in a direction substantially perpendicular to the first direction.

In various example embodiments, the first flexible substrate and the second flexible substrate may at least partially overlap each other when the second surface of the plate structure is viewed in the first direction.

In various example embodiments, the circuit board may be spaced apart from the opening area in a second direction perpendicular to the first direction, and the second connector may be coupled to the first connector in substantially the second direction.

In various example embodiments, a battery frame that at least partially surrounds a battery may be formed on the second surface of the plate. The electronic device may further include a bracket facing the battery frame and fixed to the plate. At least part of the first flexible substrate may be attached to the battery frame, and at least part of the second flexible substrate may be attached to the bracket.

In various example embodiments, the first flexible substrate may include a first stiffener comprising a material having a specified stiffness attached to the battery frame, and the second flexible substrate may include a second stiffener comprising a material having a specified stiffness attached to the bracket.

In various example embodiments, the bracket may include a first bracket to which the second stiffener is coupled and a second bracket hook-coupled to the first bracket and fixed to the plate. The second bracket may include fixing portions accommodated in recesses provided on opposite sides of the opening area. The fixing portions may be disposed in a compressed state in the recesses to press against sidewalls of the recesses 144.

In various example embodiments, the electronic device may further include a processor disposed on the circuit board and a display driver integrated circuit (IC) disposed on the first flexible substrate. The first flexible substrate and the second flexible substrate may be electrically connected to the processor and the display driver IC.

According to various embodiments of the disclosure, the electronic device may include the flexible substrates partially bent in the Z-axis direction, and thus the relatively limited inner space may be efficiently used. For example, the space facing the Z-axis direction in the inner space of the electronic device may be used. Furthermore, the electronic device may include the bracket structure mechanically constraining the flexible substrates. Accordingly, the shapes of the flexible substrates may be specified and may be used for design and control. In addition, the electronic device may include the flexible substrates and the connectors having relatively reduced sizes. Accordingly, an assembly process may be improved, and manufacturing cost may be reduced.

In addition, the disclosure may provide various effects that are directly or indirectly recognized.

Various embodiments of the disclosure and terms used herein are not intended to limit the technologies described in the disclosure to specific embodiments, and it should be understood that the various embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may refer to the device being "capable of" operating together with another device or other parts. For example, a "processor configured to (or set to) perform A, B, and C" may refer to a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device.

The term "module" used herein may include a unit, which is implemented with hardware, software, or firmware, or any combination thereof, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media (e.g., the memory) in the form of a program module. The instruction, when executed by a processor (e.g., the processor), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may include single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

The invention claimed is:

1. An electronic device comprising:
   a housing including a plate, a frame at least partially surrounding the plate, and a back plate facing a second surface of the plate and coupled to the frame, the back plate including a planar area facing a first direction;
   a display module comprising a display disposed on a first surface of the plate;

a battery and a circuit board disposed on the second surface of the plate;

a first flexible substrate extending from the display module, the first flexible substrate extending to the second surface of the plate through an opening area of the plate; and a second flexible substrate extending from the circuit board to the first flexible substrate across the battery, wherein the first flexible substrate includes a first area, at least part of the first flexible substrate being located in the opening area, a second area extending from the first area toward the back plate, and a first connector disposed on the second area, wherein the second flexible substrate includes a third area, at least part of the second flexible substrate being located between the battery and the back plate, a fourth area extending from the third area toward the second surface of the plate, and a second connector disposed on the fourth area, and wherein the first flexible substrate and the second flexible substrate are arranged such that the first connector and the second connector are coupled in a second direction different from the first direction.

2. The electronic device of claim 1, wherein the first connector is hidden by the second flexible substrate when the second surface of the plate is viewed in the first direction.

3. The electronic device of claim 1, wherein the second direction is substantially perpendicular to the first direction.

4. The electronic device of claim 1, further comprising:
a bracket spaced apart from a battery frame by a gap and fixed to the plate, the battery frame at least partially surrounding the battery, wherein one of the second area or the fourth area is disposed on the battery frame, and another of the second area or the fourth area is coupled to the bracket.

5. The electronic device of claim 1, wherein the first area includes a layer extending from at least a part of layers included in the display module.

6. The electronic device of claim 1, further comprising:
a display driver integrated circuit (IC) disposed on the first area of the first flexible substrate, wherein the display driver IC is configured to drive the display module.

7. The electronic device of claim 4, wherein the bracket is fixed to one side and an opposite side of the opening area.

8. The electronic device of claim 4, wherein the first flexible substrate includes a first stiffener comprising a material having a specified stiffness located on the second area, wherein the second flexible substrate includes a second stiffener comprising a material having a specified stiffness located on the fourth area, and wherein the bracket is coupled to the first stiffener or the second stiffener.

9. The electronic device of claim 7, wherein the plate includes a recess located around the opening area, and wherein the bracket includes a fixing portion, at least part of the fixing portion being accommodated in the recess.

10. The electronic device of claim 7, wherein the fixing portion is configured to provide an elastic force to a sidewall of the recess.

11. The electronic device of claim 7, wherein the first flexible substrate includes a first stiffener comprising a material having a specified stiffness located on the second area, wherein the second flexible substrate includes a second stiffener comprising a material having a specified stiffness located on the fourth area, and wherein the bracket includes a bending portion bent to surround part of the first stiffener or part of the second stiffener.

12. The electronic device of claim 7, wherein the bracket includes a first bracket having a size smaller than a size of the opening area and coupled to the second area or the fourth area and a second bracket fixed to a portion around the opening area across the opening area.

13. The electronic device of claim 12, wherein the first bracket includes a hook portion fastened with the second bracket.

14. An electronic device comprising:
a plate including a first surface, a second surface facing away from the first surface, and an opening area formed through the first surface and the second surface;

a display module including a display disposed on the first surface;

a circuit board disposed on the second surface;

a first flexible substrate extending from the display module to the second surface through the opening area and including a first connector; and a second flexible substrate extending from the circuit board and including a second connector, wherein the first connector and the second connector are coupled in a direction substantially perpendicular to a first direction being a thickness direction of the display module.

15. The electronic device of claim 14, wherein the first flexible substrate and the second flexible substrate at least partially overlap each other when the second surface of the plate is viewed in the first direction.

* * * * *